(12) United States Patent
Sano et al.

(10) Patent No.: US 11,721,672 B2
(45) Date of Patent: Aug. 8, 2023

(54) SEMICONDUCTOR DEVICE AND MANUFACTURING METHOD THEREOF

(71) Applicant: Kioxia Corporation, Tokyo (JP)

(72) Inventors: Yuichi Sano, Tokyo (JP); Masayuki Miura, Tokyo (JP); Kazuma Hasegawa, Kanagawa (JP)

(73) Assignee: KIOXIA CORPORATION, Tokyo (JP)

( * ) Notice: Subject to any disclaimer, the term of this patent is extended or adjusted under 35 U.S.C. 154(b) by 169 days.

(21) Appl. No.: 17/459,866

(22) Filed: Aug. 27, 2021

(65) Prior Publication Data
US 2022/0285320 A1 Sep. 8, 2022

(30) Foreign Application Priority Data
Mar. 5, 2021 (JP) .................................. 2021-035733

(51) Int. Cl.
*H01L 23/00* (2006.01)
*H01L 25/065* (2023.01)
*H01L 29/417* (2006.01)

(52) U.S. Cl.
CPC .......... *H01L 25/0657* (2013.01); *H01L 24/03* (2013.01); *H01L 24/05* (2013.01);
(Continued)

(58) Field of Classification Search
CPC ..... H01L 25/0657; H01L 24/03; H01L 24/05; H01L 24/49; H01L 29/41741; H01L 2224/0231; H01L 2224/0233; H01L 2224/49097; H01L 2924/1438; H01L 2924/15321; H01L 23/49816; H01L 23/49822; H01L 24/11; H01L 24/13; H01L 24/16; H01L 24/19; H01L 24/20; H01L 24/48; H01L 2224/0401;
(Continued)

(56) References Cited

U.S. PATENT DOCUMENTS

| 8,004,071 B2 | 8/2011 | Nishiyama et al. |
| 8,552,546 B2 | 10/2013 | Song et al. |

(Continued)

FOREIGN PATENT DOCUMENTS

| JP | H01-140649 | 6/1989 |
| JP | 2008-159607 A | 7/2008 |

(Continued)

*Primary Examiner* — Elias Ullah
(74) *Attorney, Agent, or Firm* — Foley & Lardner LLP

(57) ABSTRACT

A semiconductor device includes a first stacked body including a plurality of first semiconductor chips stacked along a first direction, each of the first semiconductor chips being offset from the other first semiconductor chips along a second direction perpendicular to the first direction; a first columnar electrode connected to an electrode pad of the first stacked body, and extending in the first direction; a second stacked body including a plurality of second semiconductor chips stacked along the first direction, each of the second semiconductor chips being offset from the other second semiconductor chips along the second direction, the second stacked body having a height larger than the first stacked body and overlap at least a portion of the first stacked body when viewed from the top; and a second columnar electrode connected to an electrode pad of the second stacked body, and extending in the first direction.

17 Claims, 31 Drawing Sheets

(52) U.S. Cl.
CPC ........ *H01L 24/49* (2013.01); *H01L 29/41741* (2013.01); *H01L 2224/0231* (2013.01); *H01L 2224/0233* (2013.01); *H01L 2224/49097* (2013.01); *H01L 2924/1438* (2013.01); *H01L 2924/15321* (2013.01)

(58) Field of Classification Search
CPC ... H01L 2224/16227; H01L 2224/2101; H01L 2224/214; H01L 2224/221; H01L 2224/33181; H01L 2224/73204; H01L 2224/73253; H01L 2224/9202; H01L 2225/06572; H01L 25/18; H01L 2224/16145; H01L 2224/2105; H01L 2224/2919; H01L 2224/32145; H01L 2224/32225; H01L 2224/45144; H01L 2224/48145; H01L 2224/48147; H01L 2224/73215; H01L 2224/73265; H01L 2224/92143; H01L 2224/92242; H01L 2224/95; H01L 2224/96; H01L 2225/06506; H01L 2225/06517; H01L 2225/06541; H01L 2225/06548; H01L 2225/06562; H01L 2225/06565; H01L 2924/181; H01L 23/4824; H01L 21/561; H01L 23/3107; H01L 23/485; H01L 24/85; H01L 2224/02331; H01L 2224/02333; H01L 2224/02381

See application file for complete search history.

(56) References Cited

U.S. PATENT DOCUMENTS

| | | |
|---|---|---|
| 10,497,671 B2 | 12/2019 | Cho et al. |
| 2008/0150157 A1 | 6/2008 | Nishimura et al. |
| 2009/0096111 A1 | 4/2009 | Fujiwara et al. |
| 2010/0148172 A1 | 6/2010 | Watanabe et al. |
| 2013/0093103 A1 | 4/2013 | Kim et al. |
| 2019/0385977 A1 | 12/2019 | Elsherbini et al. |
| 2020/0075543 A1 | 3/2020 | Kosaka |
| 2020/0176384 A1 | 6/2020 | Wu et al. |
| 2020/0294922 A1 | 9/2020 | Otsuka |

FOREIGN PATENT DOCUMENTS

| | | |
|---|---|---|
| JP | 2009-099697 A | 5/2009 |
| JP | 2009-158739 | 7/2009 |
| JP | 2011-054725 | 3/2011 |
| JP | 2010-147070 A | 7/2020 |
| JP | 2020-150145 | 9/2020 |
| TW | 202011546 A | 3/2020 |
| TW | 202013652 A | 4/2020 |
| TW | 202021073 A | 6/2020 |

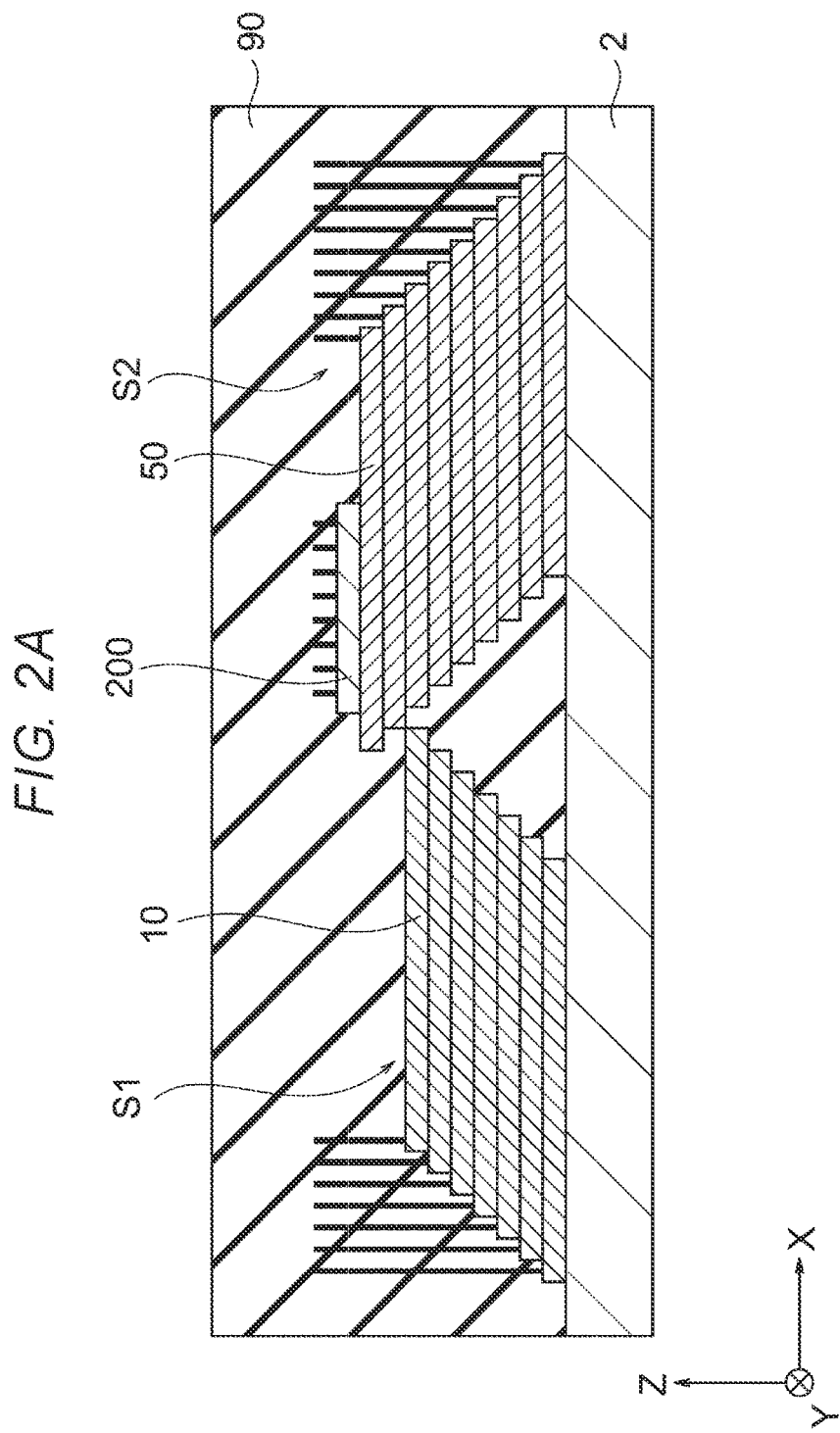

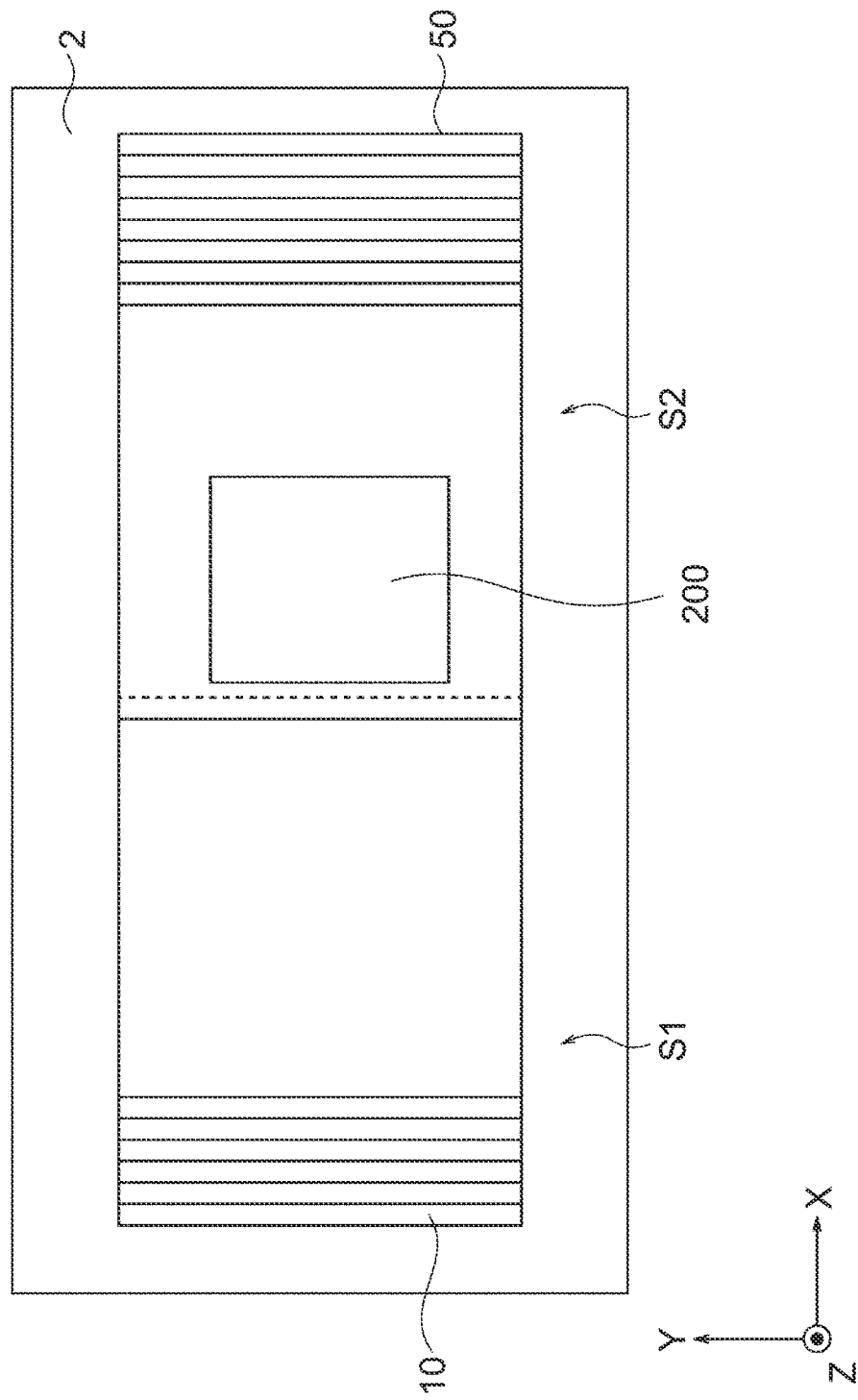

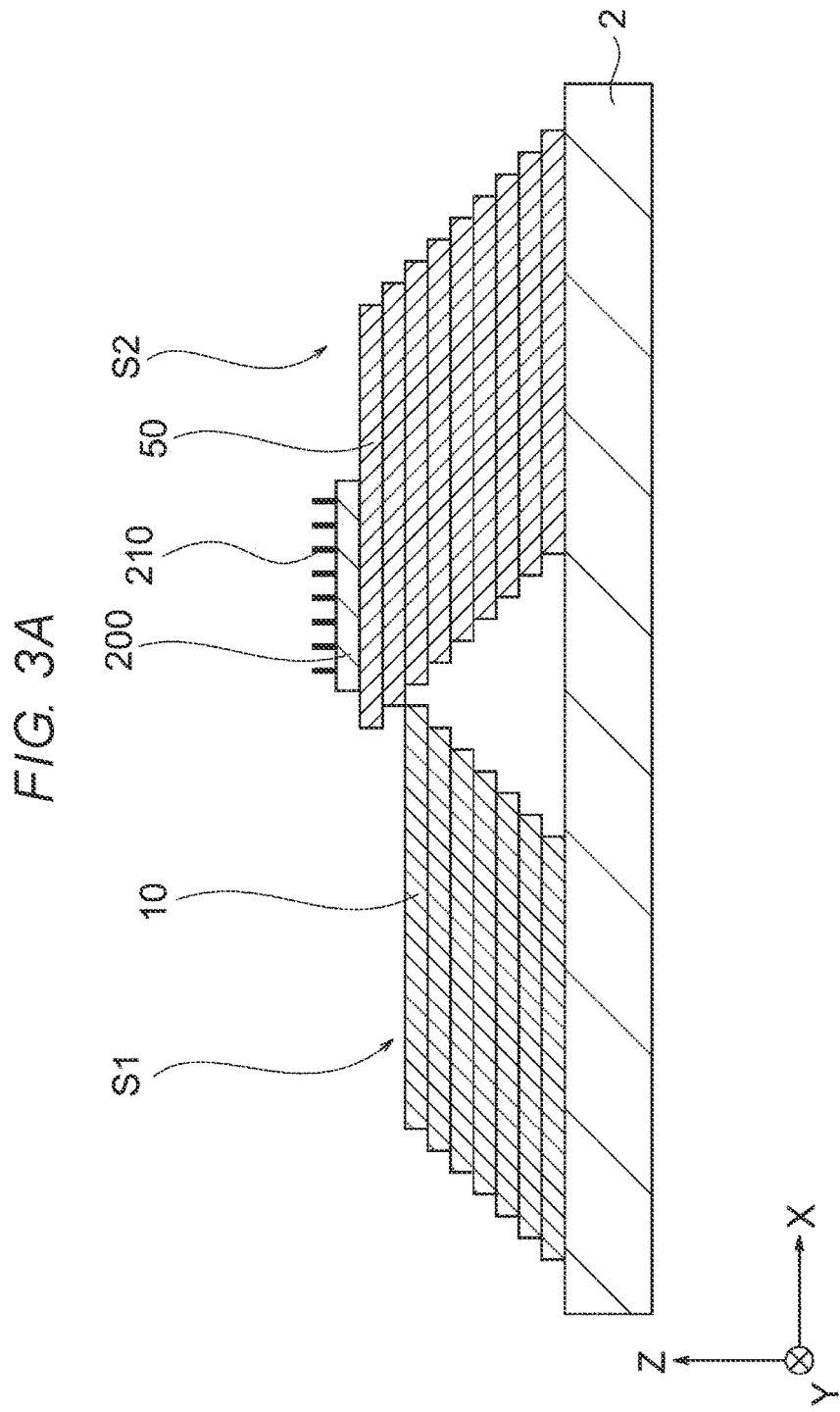

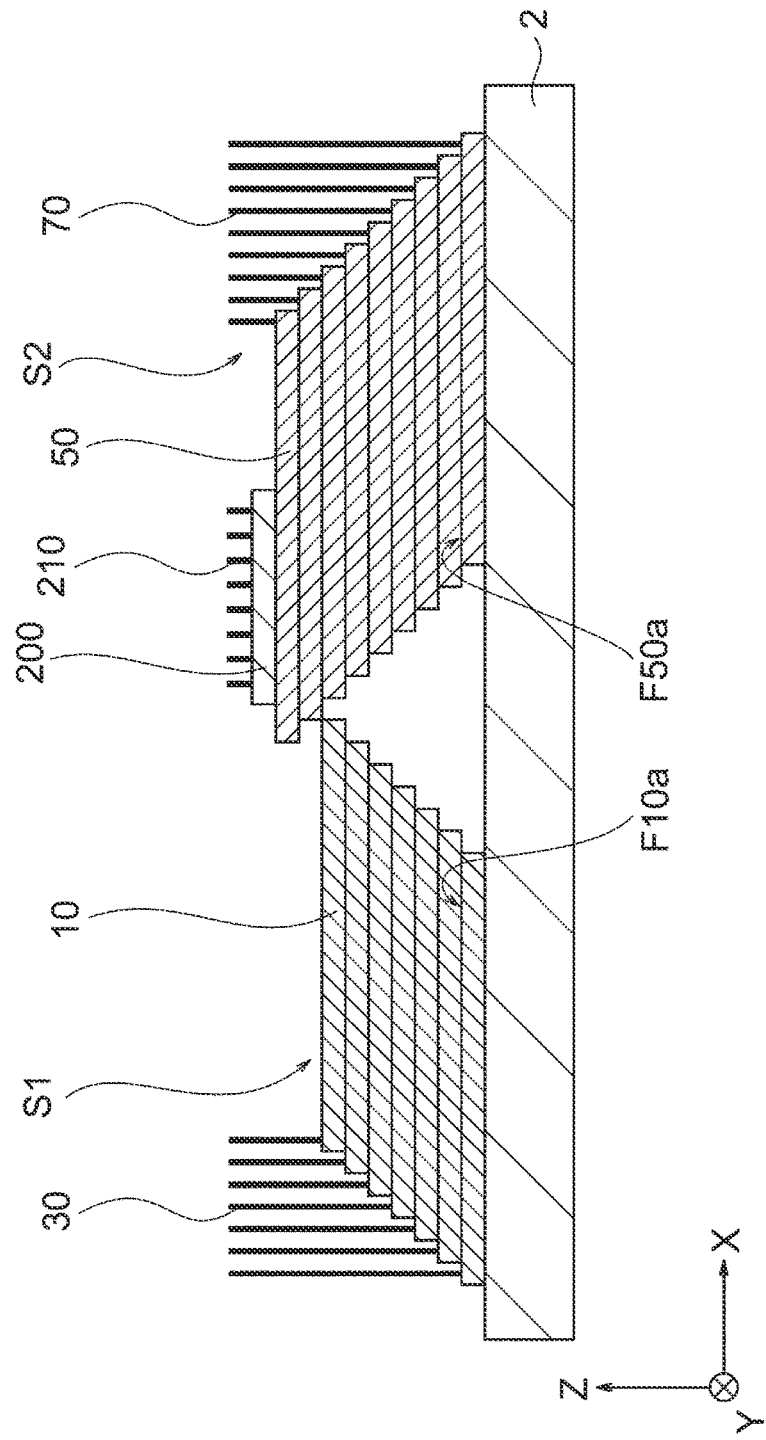

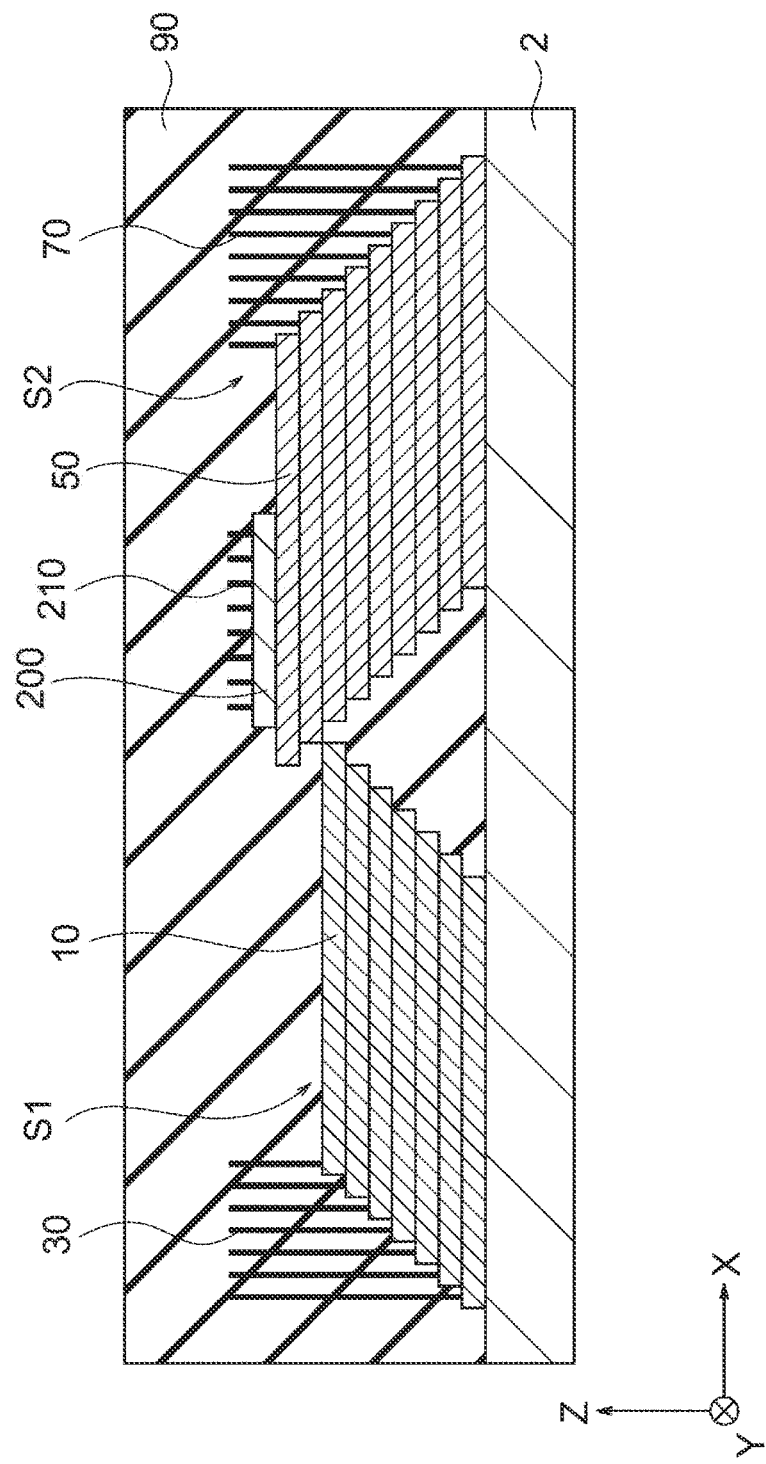

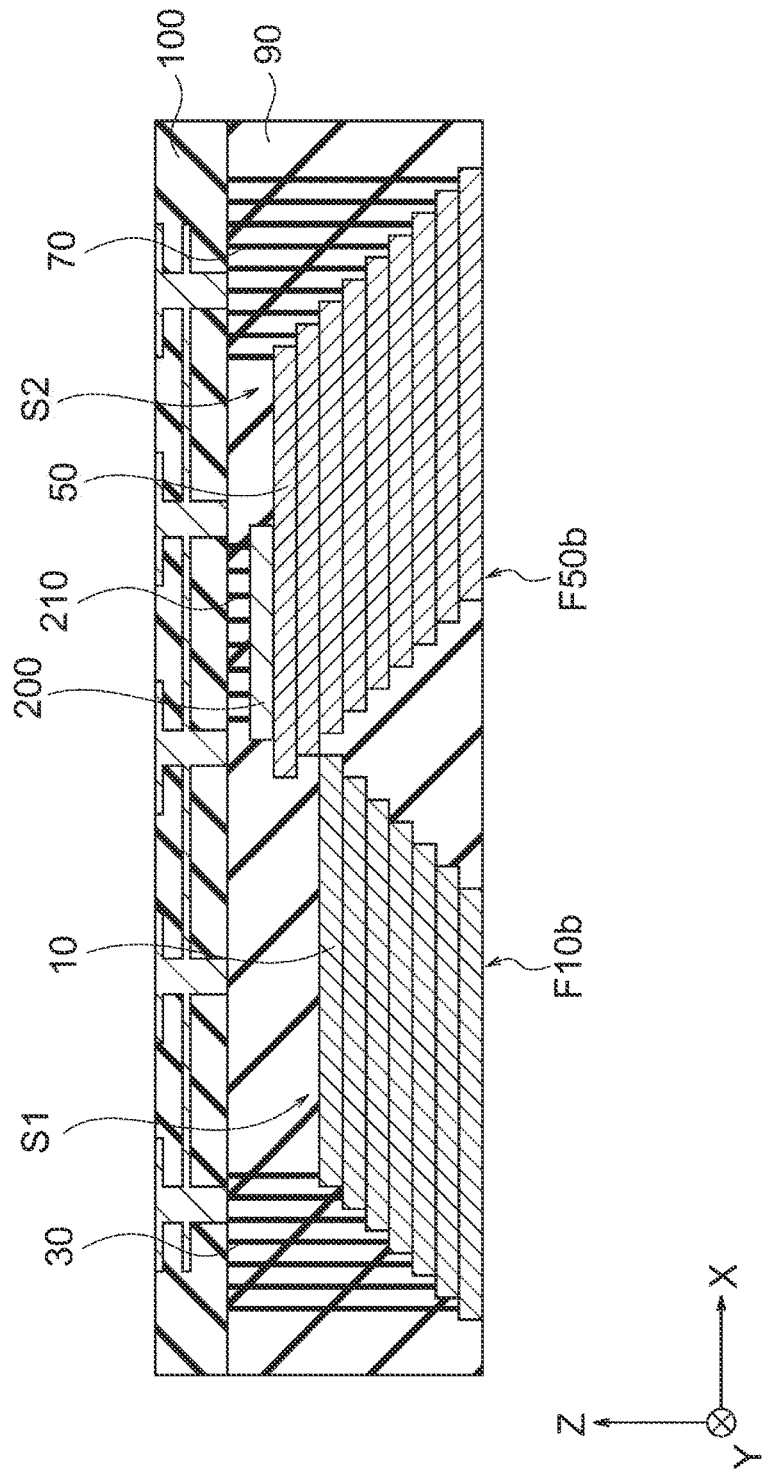

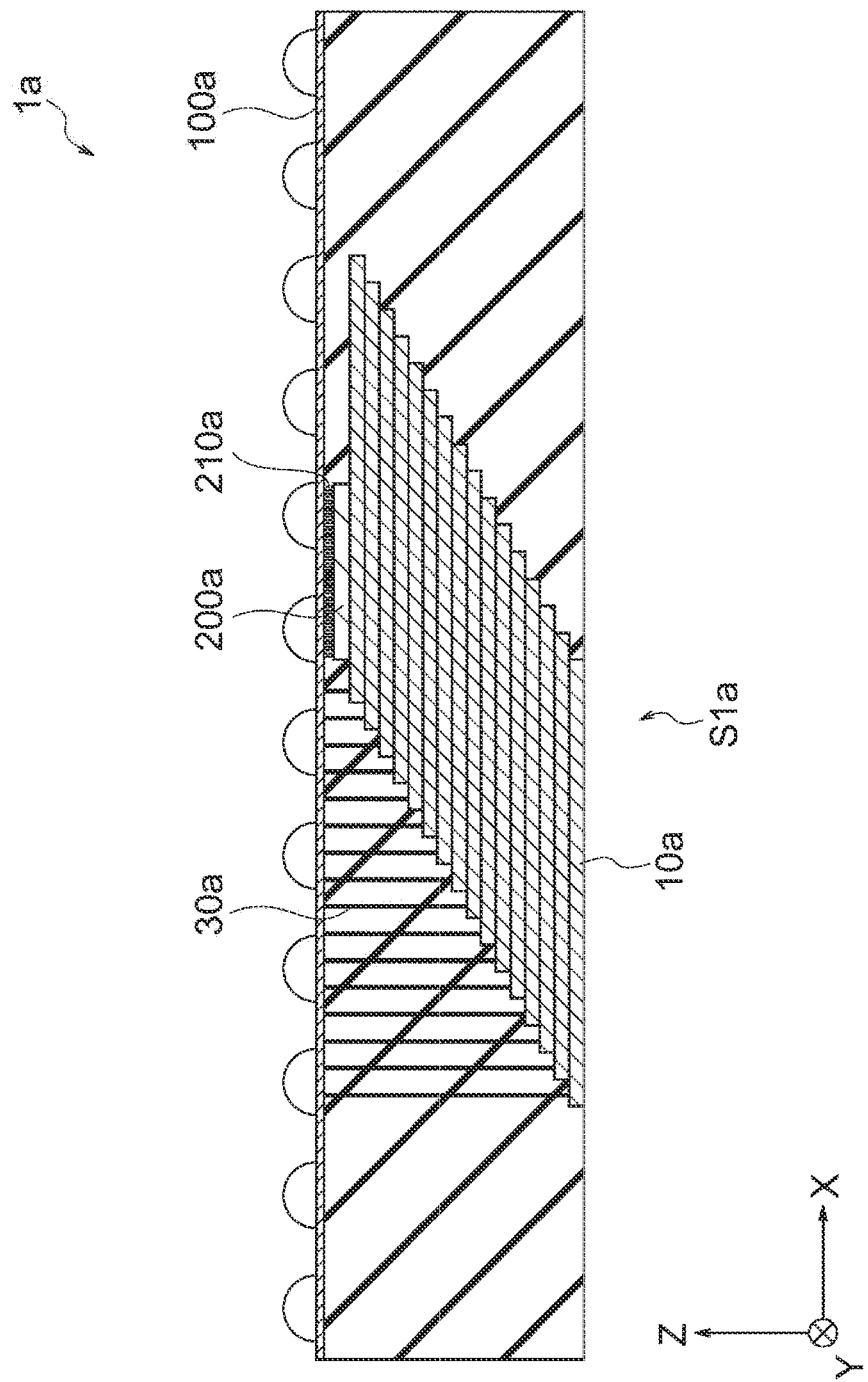

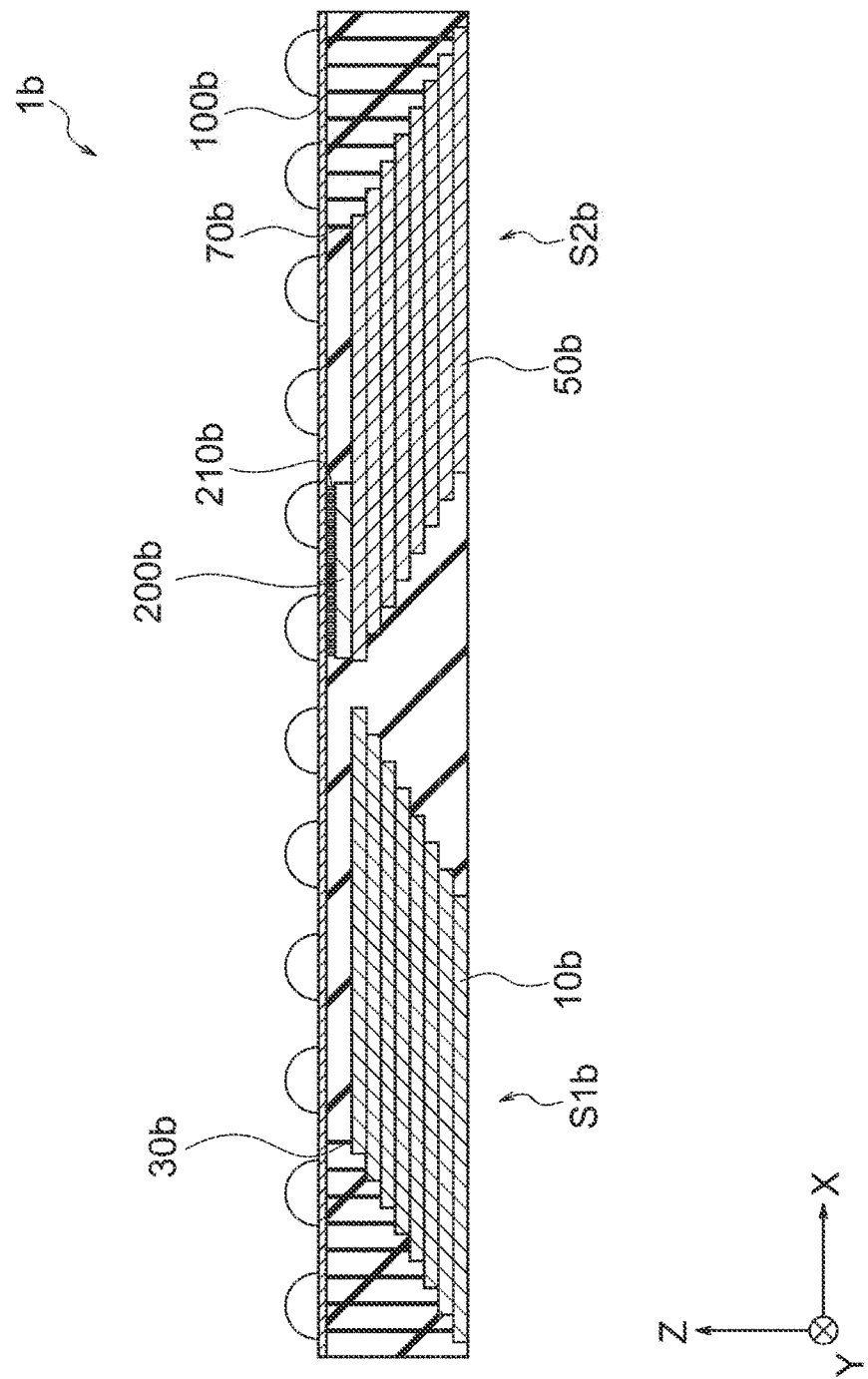

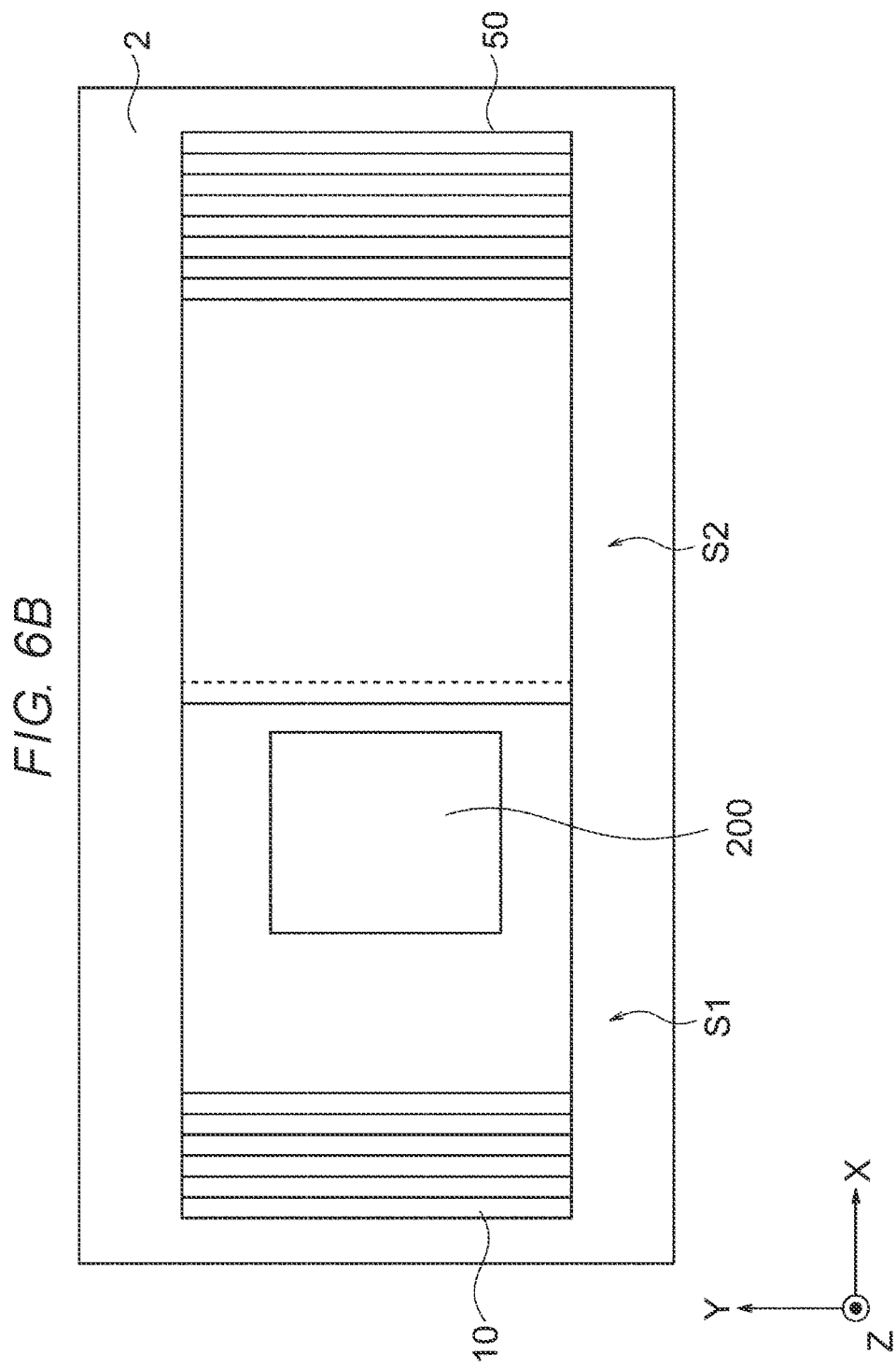

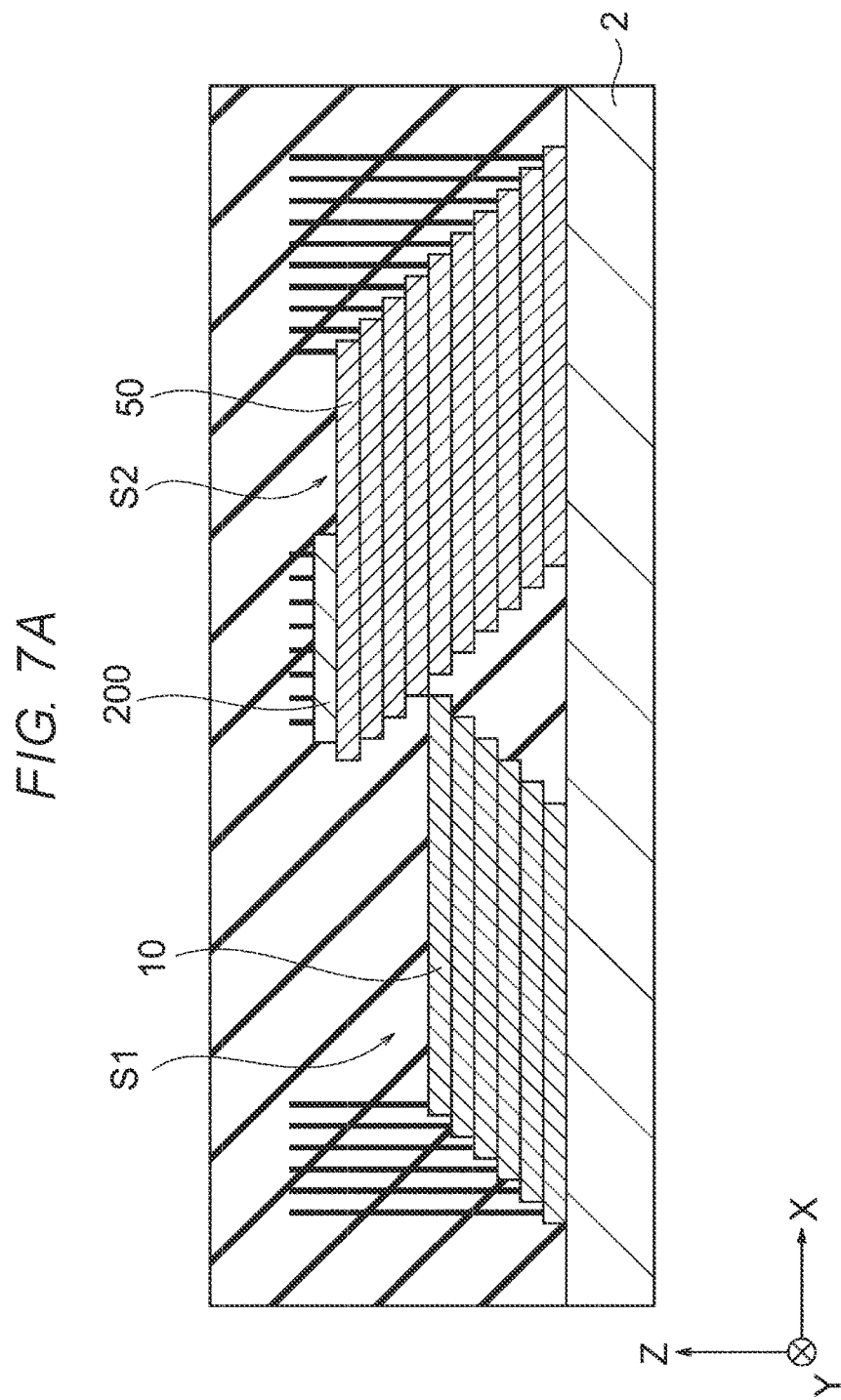

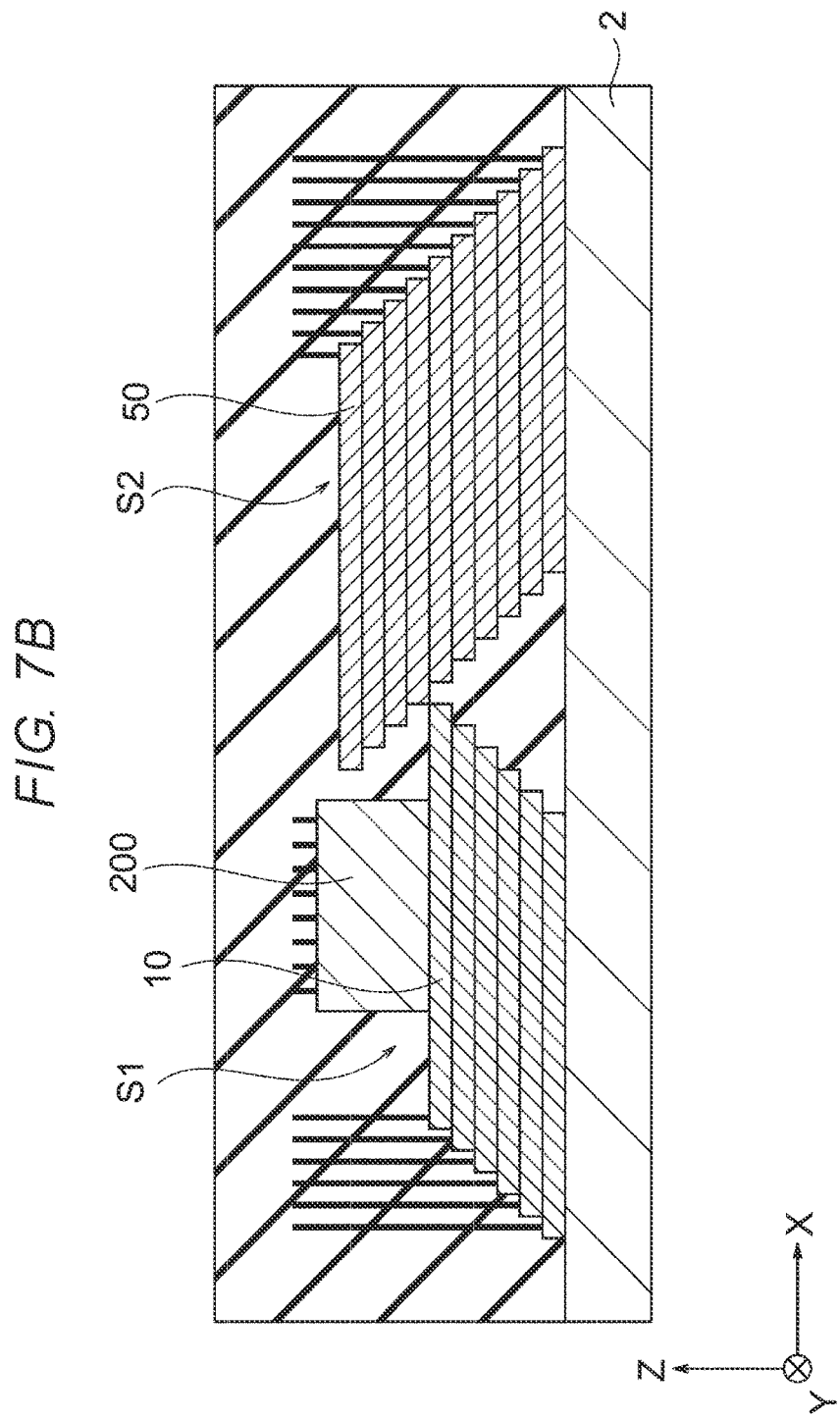

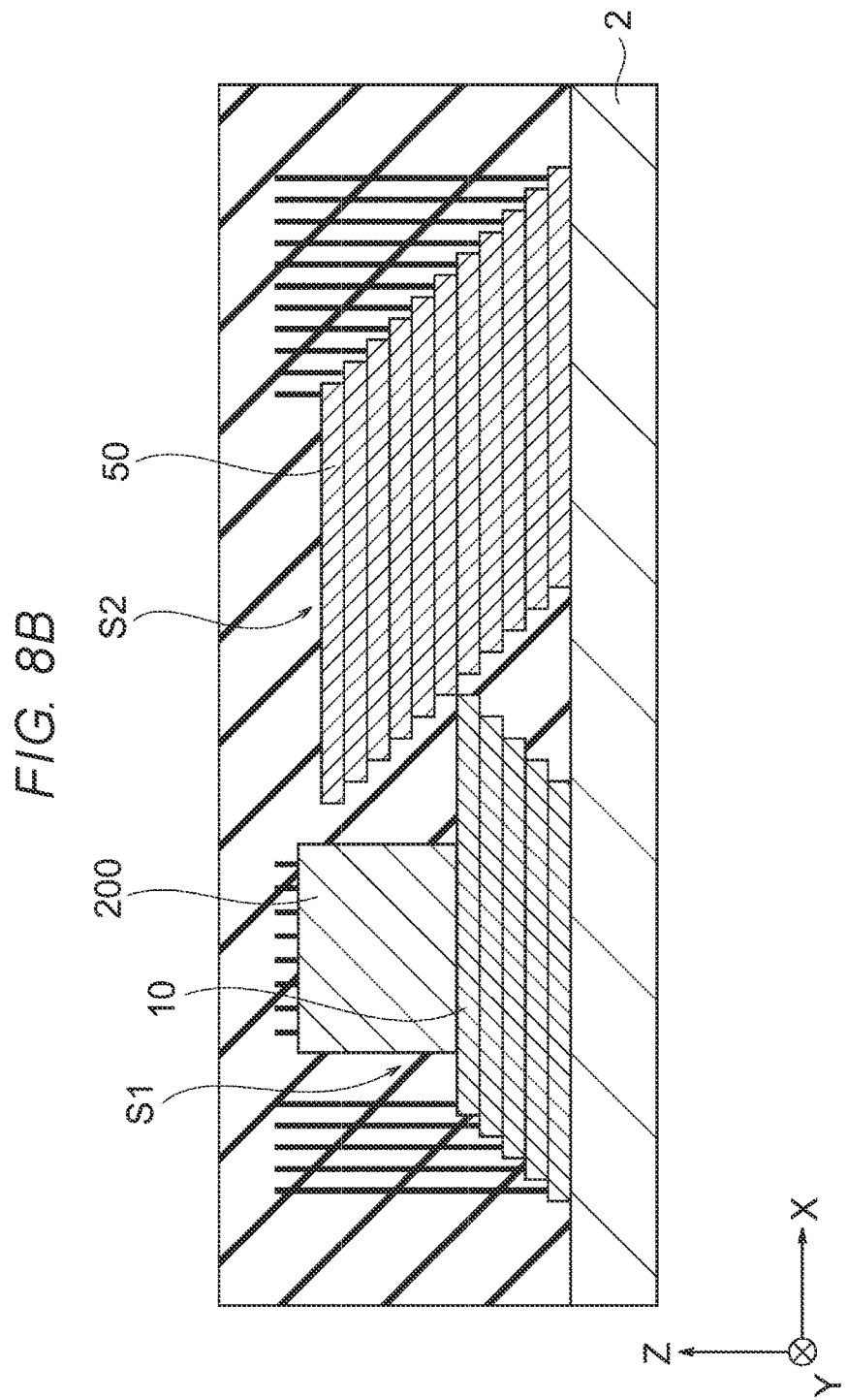

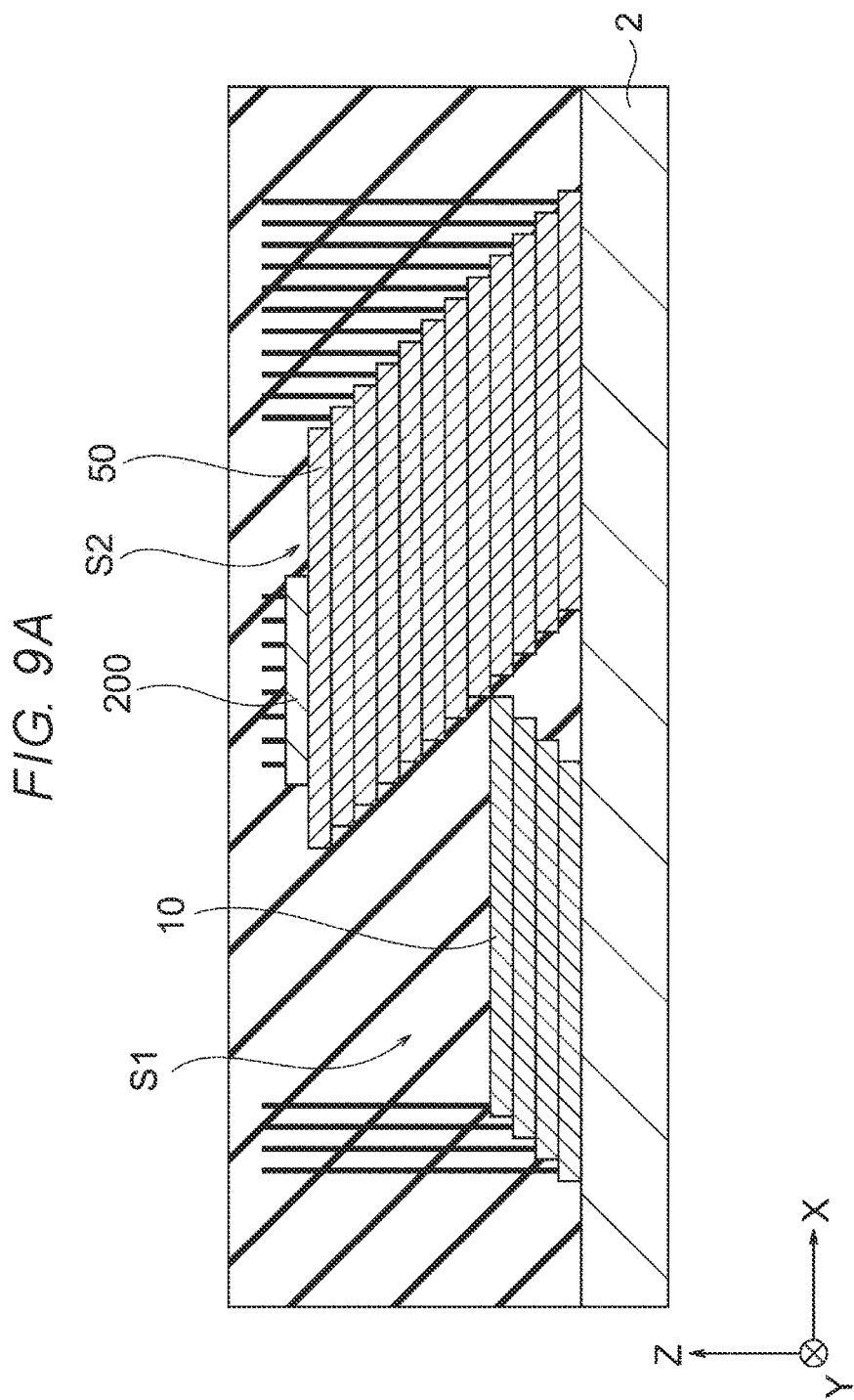

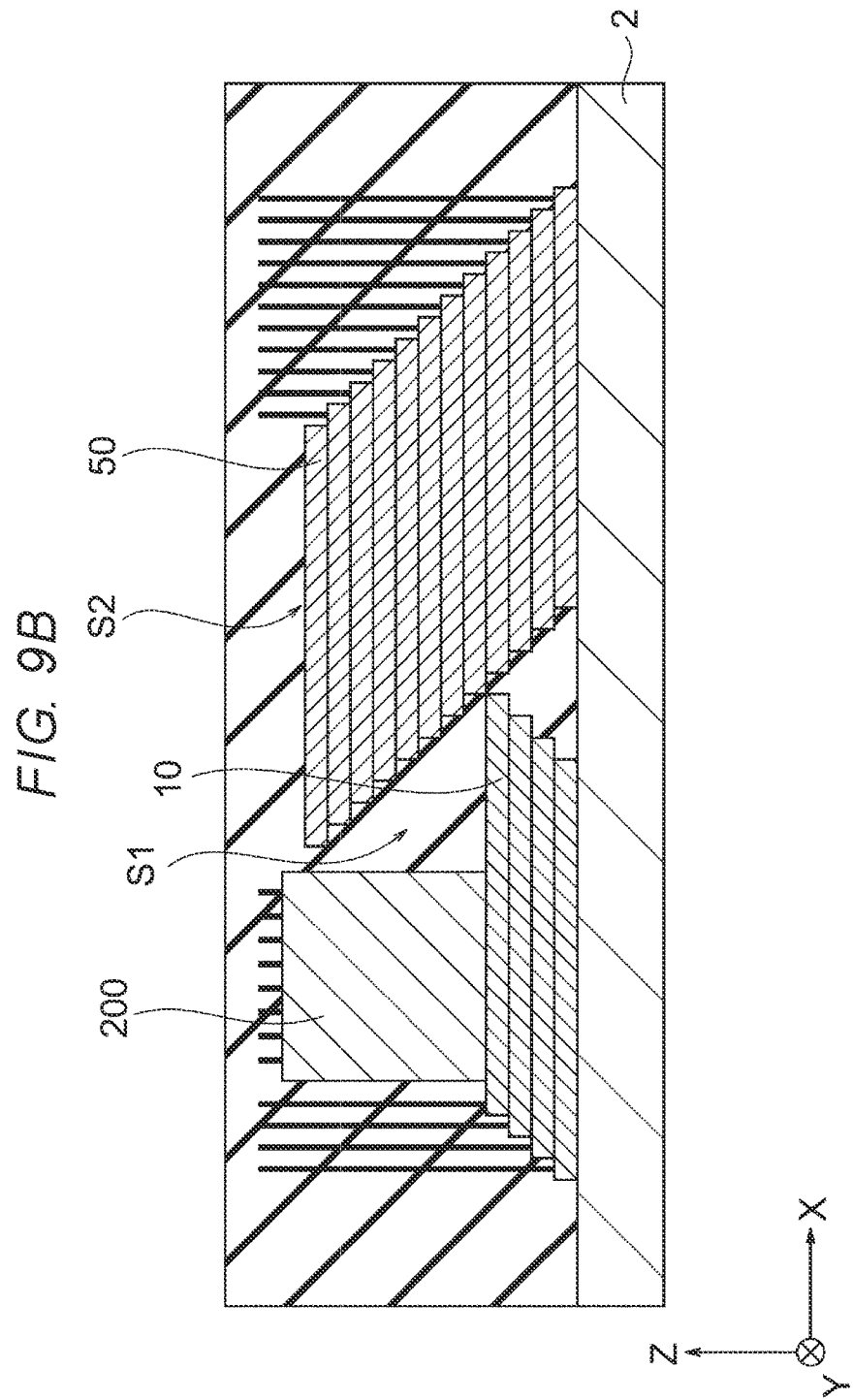

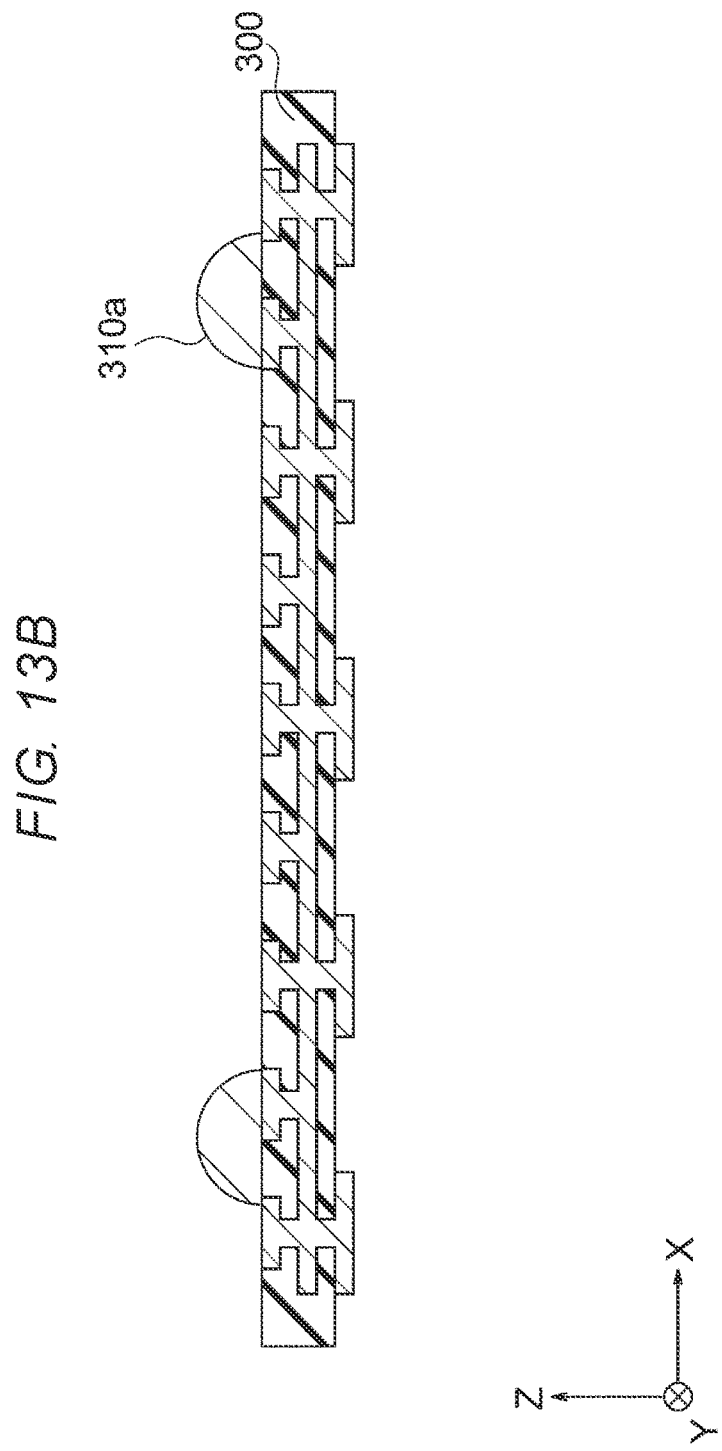

SEMICONDUCTOR DEVICE AND MANUFACTURING METHOD THEREOF

CROSS-REFERENCE TO RELATED APPLICATION(S)

This application is based upon and claims the benefit of priority from Japanese Patent Application No. 2021-035733, filed Mar. 5, 2021, the entire contents of which are incorporated herein by reference.

FIELD

Embodiments described herein relate generally to a semiconductor device and a manufacturing method thereof.

BACKGROUND

In a package structure of a semiconductor device, a semiconductor chip such as a memory chip is provided on a substrate. It is desired to reduce a size of the package.

DESCRIPTION OF THE DRAWINGS

FIG. 2A is a cross-sectional view showing an example of the configuration of the semiconductor device according to the first embodiment.

FIG. 2B is a plan view showing an example of the configuration of the semiconductor device according to the first embodiment.

FIG. 3A is a cross-sectional view showing an example of a manufacturing method of the semiconductor device according to the first embodiment.

FIG. 3B is a cross-sectional view showing the example of the manufacturing method of the semiconductor device, following FIG. 3A.

FIG. 3C is a cross-sectional view showing the example of the manufacturing method of the semiconductor device, following FIG. 3B.

FIG. 3E is a cross-sectional view showing the example of the manufacturing method of the semiconductor device, following FIG. 3D.

FIG. 4 is a cross-sectional view showing an example of a configuration of a semiconductor device according to a first comparative example.

FIG. 5 is a cross-sectional view showing an example of a configuration of a semiconductor device according to a second comparative example.

FIG. 6B is a plan view showing the example of the configuration of the semiconductor device according to the first modification of the first embodiment.

FIG. 7A is a cross-sectional view showing an example of a configuration of a semiconductor device according to a second modification of the first embodiment.

FIG. 7B is a cross-sectional view showing an example of a configuration of a semiconductor device according to a third modification of the first embodiment.

FIG. 8B is a cross-sectional view showing an example of a configuration of a semiconductor device according to a fifth modification of the first embodiment.

FIG. 9A is a cross-sectional view showing an example of a configuration of a semiconductor device according to a sixth modification of the first embodiment.

FIG. 9B is a cross-sectional view showing an example of a configuration of a semiconductor device according to a seventh modification of the first embodiment.

FIG. 13B is a cross-sectional view showing the example of the manufacturing method of the semiconductor device, following FIG. 13A.

DETAILED DESCRIPTION

Figure 1:
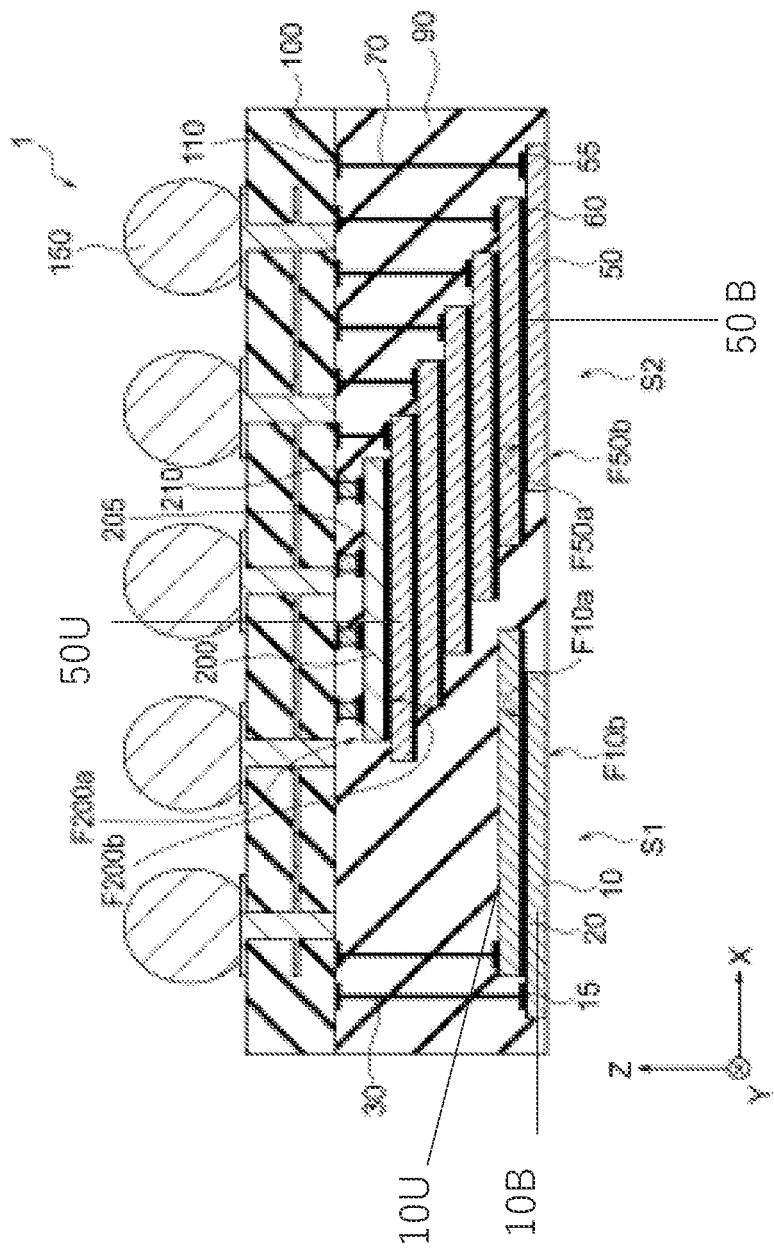
FIG. 1 is a cross-sectional view showing an example of a configuration of a semiconductor device according to a first embodiment.

Embodiments provide a semiconductor device capable of making a package smaller and a manufacturing method thereof.

In general, according to one embodiment, a semiconductor device includes a first stacked body including a plurality of first semiconductor chips stacked along a first direction, each of the first semiconductor chips being offset from the other first semiconductor chips along a second direction perpendicular to the first direction; a first columnar electrode connected to an electrode pad of the first stacked body, and extending in the first direction; a second stacked body including a plurality of second semiconductor chips stacked along the first direction, each of the second semiconductor chips being offset from the other second semiconductor chips along the second direction, the second stacked body having a height larger than the first stacked body and overlap at least a portion of the first stacked body when viewed from the top; and a second columnar electrode connected to an electrode pad of the second stacked body, and extending in the first direction.

Hereinafter, embodiments according to the present disclosure will be described with reference to the drawings. The present disclosure is not limited to the present embodiments. In the following embodiments, a vertical direction indicates a relative direction when a stacking direction of a semiconductor chip is upward or downward, and may be different from a vertical direction according to a gravity acceleration. The drawings are schematic or conceptual drawings. Ratios or the like of respective parts are not necessarily the same as actual ones. In the specification and the drawings, the same elements as those described in preceding drawings are denoted by the same reference numerals, and a detailed description is omitted as appropriate.

(First Embodiment) FIG. 1 is a cross-sectional view showing an example of a configuration of a semiconductor device 1 according to a first embodiment. The semiconductor device 1 includes a stacked body S1, columnar electrodes 30, a stacked body S2, columnar electrodes 70, a semiconductor chip 200, connection pillars 210, a resin layer 90, a redistribution layer 100, and metal bumps 150. The semiconductor device 1 may be, for example, a semiconductor package such as a NAND flash memory or a large scale integration (LSI).

The stacked body S1 includes semiconductor chips 10 and an adhesive layer 20. The adhesive layer 20 is, for example, a die attachment film (DAF). The stacked body S1 is a stacked body in which a plurality of semiconductor chips 10 are stacked so as to be deviated toward a direction perpendicular to the stacking direction.

Each of the plurality of semiconductor chips 10 has a first surface F10a and a second surface F10b opposite to the first surface. A semiconductor device (not shown) such as a memory cell array, a transistor, or a capacitor is formed on the first surface F10a of each semiconductor chip 10. The semiconductor device on the first surface F10a of the semiconductor chip 10 is covered and protected by an insulating film (not shown). For the insulating film, for example, an inorganic insulating material such as a silicon oxide film or a silicon nitride film is used. In addition, a material in which an organic insulating material is formed on the inorganic insulating material may be used for the insulating film. Examples of the organic insulating material include an organic insulating material such as resins such as a phenol-based resin, a polyimide-based resin, a polyamide-based resin, an acrylic-based resin, an epoxy-based resin, a p-phenylenebenzobisoxazole (PBO)-based resin, a silicone-based resin, and a benzocyclobutene-based resin, or a mixed material or a composite material of these resins. The semiconductor chip 10 may be, for example, a memory chip of the NAND flash memory or a semiconductor chip on which any LSI is mounted. The semiconductor chips 10 may be semiconductor chips having the same configuration, or may be semiconductor chips having different configurations.

The plurality of semiconductor chips 10 are stacked and bonded by the adhesive layer 20. Examples of the adhesive layer 20 include an organic insulating material such as resins, e.g., a phenol-based resin, a polyimide-based resin, a polyamide-based resin, an acrylic-based resin, an epoxy-based resin, a p-phenylenebenzobisoxazole (PBO) -based resin, a silicone-based resin, and a benzocyclobutene-based resin, or a mixed material or a composite material of these resins. Each of the plurality of semiconductor chips 10 includes an electrode pad 15 exposed on the first surface F10a. One semiconductor chip 10 (upper semiconductor chip 10) stacked on another semiconductor chip 10 (lower semiconductor chip 10) is stacked so as to be deviated toward a substantially vertical direction (X direction) with respect to a side on which the electrode pad 15 of the lower semiconductor chip 10 is provided, thereby not overlapping the electrode pad 15 of the lower semiconductor chip 10.

The electrode pad 15 is electrically connected to one of the semiconductor devices provided on the semiconductor chip 10. For the electrode pad 15, for example, a low-resistance metal such as a single substance of Cu, Ni, W, Au, Ag, Pd, Sn, Bi, Zn, Cr, Al, Ti, Ta, TiN, TaN, or CrN, a composite film of two or more of these single substances, or an alloy of two or more of these single substances is used.

The columnar electrodes 30 are connected to the electrode pads 15 of the semiconductor chips 10 and extend in the stacking direction (Z direction) of the plurality of semiconductor chips 10. The adhesive layer 20 is partially removed so as to expose a part of the electrode pads 15, and the columnar electrodes 30 can be connected to the electrode pads 15. Alternatively, the adhesive layer 20 is attached to the second surface F10b of the upper semiconductor chip 10, and is provided so as not to overlap the electrode pads 15 of the lower semiconductor chips 10. Lower ends of the columnar electrodes 30 are connected to the electrode pads 15 by, for example, a wire bonding method. Upper ends of the columnar electrodes 30 reach an upper surface of the resin layer 90, and are exposed on the upper surface of the resin layer 90. The upper ends of the columnar electrodes 30 are connected to electrode pads 110 of the redistribution layer 100.

The semiconductor chips 10 of the stacked body S1 are stacked so as to be deviated toward the stacked body S2, thereby exposing the electrode pads 15. The columnar electrodes 30 are connected to the electrode pads 15, which are disposed on a side opposite to the stacked body S2 on the first surfaces F10a.

The stacked body S2 includes semiconductor chips 50 and adhesive layers 60. The stacked body S2 is a stacked body in which a plurality of semiconductor chips 50 are stacked so as to be deviated toward a direction perpendicular to the stacking direction. The stacked body S2 includes a second lowermost layer chip 50B, which is the lowest layer semiconductor chip, and a second uppermost layer chip 50U, which is the uppermost layer semiconductor chip, among the plurality of semiconductor chips. The stacked body S1 includes a first lowermost layer chip 10B, which is the lowest layer semiconductor chip, and a first uppermost layer chip 10U, which is the uppermost layer semiconductor chip, among the plurality of semiconductor chips.

Details of a relationship between the stacked body S1 and the stacked body S2 will be described later with reference to FIGS. 2A and 2B.

Each of the plurality of semiconductor chips 50 has a first surface F50a and a second surface F50b opposite to the first surface F50a. A semiconductor device (not shown) such as a memory cell array, a transistor, or a capacitor is formed on the first surface F50a of each semiconductor chip 50. The semiconductor device on the first surface F50a of the semiconductor chip 50 is covered and protected by an insulating film (not shown). For the insulating film, for example, an inorganic insulating material such as a silicon oxide film or a silicon nitride film is used. In addition, a material in which an organic insulating material is formed on the inorganic insulating material may be used for the insulating film. Examples of the organic insulating material include an organic insulating material such as resins such as a phenol-based resin, a polyimide-based resin, a polyamide-based resin, an acrylic-based resin, an epoxy-based resin, a p-phenylenebenzobisoxazole (PBO)-based resin, a silicone-based resin, and a benzocyclobutene-based resin, or a mixed material or a composite material of these resins. The semiconductor chip 50 may be, for example, a memory chip of the NAND flash memory or a semiconductor chip on which any LSI is mounted. The semiconductor chips 50 maybe semiconductor chips having the same configuration, or may be semiconductor chips having different configurations. Further, the semiconductor chip 50 may be a semiconductor chip having the same configuration as the semiconductor chip 10, or may be a semiconductor chip having a configuration different from that of the semiconductor chip 10.

The plurality of semiconductor chips 50 are stacked and adhered by the adhesive layers 60. Each of the plurality of semiconductor chips 50 includes an electrode pad 55 exposed on the first surface F50a. One semiconductor chip 50 stacked on another semiconductor chips 50 is stacked so as to be deviated toward a substantially vertical direction (X direction) with respect to a side on which the electrode pad 55 is provided, thereby not overlapping the electrode pad 55 of the other semiconductor chip 50.

The electrode pad 55 is electrically connected to one of the semiconductor devices provided on the semiconductor chip 50. For the electrode pad 55, for example, a low-resistance metal such as a single substance of Cu, Ni, W, Au, Ag, Pd, Sn, Bi, Zn, Cr, Al, Ti, Ta, TiN, TaN, or CrN, a composite film of two or more of these single substances, or an alloy of two or more of these single substances is used.

The columnar electrodes 70 are connected to the electrode pads 55 of the semiconductor chips 50 and extend in the stacking direction (Z direction) of the plurality of semiconductor chips 50. The adhesive layers 60 are partially removed so as to expose a part of the electrode pads 55, and the columnar electrodes 70 can be connected to the electrode pads 55. Alternatively, the adhesive layer 60 is attached to a second surface F50b of an upper semiconductor chip 50, and is provided so as not to overlap the electrode pad 55 of a lower semiconductor chip 50. Lower ends of the columnar electrodes 70 are connected to the electrode pads 55 by, for example, the wire bonding method. Upper ends of the columnar electrodes 70 reach the upper surface of the resin layer 90, and are exposed on the upper surface of the resin layer 90. The upper ends of the columnar electrodes 70 are connected to the electrode pads 110 of the redistribution layer 100.

The semiconductor chips 50 of the stacked body S2 are stacked so as to be deviated toward the stacked body S1, thereby exposing the electrode pads 55. The columnar electrodes 70 are connected to the electrode pads 55, which are disposed on a side opposite to the stacked body S1 on the first surfaces F50a.

The semiconductor chip 200 has a first surface F200a and a second surface F200b opposite to the first surface. A semiconductor device (not shown) such as a transistor or a capacitor is formed on the first surface F200a of the semiconductor chip 200. The semiconductor device on the first surface F200a of the semiconductor chip 200 is covered and protected by an insulating film (not shown). For the insulating film, for example, an inorganic insulating material such as a silicon oxide film ora silicon nitride film is used. In addition, a material in which an organic insulating material is formed on the inorganic insulating material maybe used for the insulating film. Examples of the organic insulating material include an organic insulating material such as resins such as a phenol-based resin, a polyimide-based resin, a polyamide-based resin, an acrylic-based resin, an epoxy-based resin, a p-phenylenebenzobisoxazole (PBO) -based resin, a silicone-based resin, and a benzocyclobutene-based resin, or a mixed material or a composite material of these resins. The semiconductor chip 200 may be, for example, a controller chip that controls the memory chips (the semiconductor chips 10, 50) or a semiconductor chip on which any LSI is mounted.

The semiconductor chip 200 is stacked on the semiconductor chips 50, and is bonded to the semiconductor chips 50 by an adhesive layer. The semiconductor chip 200 includes electrode pads 205 each exposed on the first surface F200a.

The connection pillars (connection bumps) 210 are connected to the electrode pads 205 of the semiconductor chip 200 and extend in the Z direction. Lower ends of the connection pillars 210 are connected to the electrode pads 205 of the semiconductor chip 200. Upper ends of the connection pillars 210 reach the upper surface of the resin layer 90, and are exposed on the upper surface of the resin layer 90. The upper ends of the connection pillars 210 are connected to the electrode pads 110 of the redistribution layer 100. For a material of the connection pillar 210, for example, a conductive metal such as Cu may be used. The columnar electrode 30 and the columnar electrode 70 may be formed by wire bonding or the like, and the connecting pillar 210 may be formed by a plating method or the like. Therefore, a diameter and a material of the columnar electrode 30, the columnar electrode 70 and the connecting pillar 210 may be different.

The stacked bodies S1, S2, the semiconductor chip 200, the columnar electrodes 30, 70, and the connection pillars 210 are covered (sealed) by the resin layer 90, and tip ends of the columnar electrodes 30, 70 and the connection pillars 210 are exposed on the upper surface.

Examples of the resin layer 90 include an organic insulating material such as resins such as a phenol-based resin, a polyimide-based resin, a polyamide-based resin, an acrylic-based resin, an epoxy-based resin, a p-phenylenebenzobisoxazole (PBO) -based resin, a silicone-based resin, and a benzocyclobutene-based resin, or a mixed material or a composite material of these resins.

The redistribution layer (RDL) 100 is provided on the resin layer 90 and is electrically connected to the columnar electrodes 30, 70 and the connection pillars 210. The redistribution layer 100 is a multilayer wiring layer in which a plurality of wiring layers and a plurality of insulating layers are stacked, and electrically connects the columnar electrodes 30, 70 and the connection pillars 210 to the metal bumps 150, respectively. FIG. 1 schematically shows the wiring layers in the redistribution layer 100.

The metal bumps 150 are provided on the redistribution layer 100 and are electrically connected to the wiring layers of the redistribution layer 100. The metal bumps 150 are used for connection to an external device (not shown). For the metal bumps 150, for example, a single substance of Sn, Ag, Cu, Au, Pd, Bi, Zn, Ni, Sb, In, or Ge, or a composite film or an alloy of two or more of these substances is used.

Next, the relationship between the stacked body S1 and the stacked body S2 will be described.

FIG. 2A is a cross-sectional view showing an example of the configuration of the semiconductor device 1 according to the first embodiment. FIG. 2B is a plan view showing the example of the configuration of the semiconductor device 1 according to the first embodiment. FIG. 2B is a view of the stacked bodies S1, S2 and the semiconductor chip 200 of FIG. 2A as viewed from the Z direction.

The stacked bodies S1, S2 shown in FIGS. 2A and 2B are different from the stacked bodies S1, S2 shown in FIG. 1 in the number of stacked layers. However, FIG. 2A and FIG. 1 are common in that the stacked body S2 is higher than the stacked body S1. In FIGS. 2A and 2B, the adhesive layers 20, 60, the electrode pads 15, 55, 205, and the like are omitted.

The stacked body S1 includes seven stacked semiconductor chips 10. The stacked body S2 includes nine stacked semiconductor chips 50. Therefore, the number of stacked layers of the stacked body S2 is larger than the number of stacked layers of the stacked body S1. In the example shown in FIG. 2A, a thickness of the semiconductor chip 10 is substantially the same as a thickness of the semiconductor chip 50. Therefore, the stacked body S2 is higher than the stacked body S1. In the example shown in FIGS. 2A and 2B, the stacked bodies S1, S2 are provided on a support substrate 2.

As shown in FIG. 2A, the semiconductor chips 10 of the stacked body S1 are stacked so as to be deviated toward the stacked body S2 (in the X direction). The semiconductor chips 50 of the stacked body S2 are stacked so as to be deviated toward the stacked body S1 (in a -X direction). As shown in FIG. 2B, the stacked body S2 overlaps at least a part of the stacked body S1 as viewed from the stacking direction (Z direction). Therefore, the stacked body S1 and the stacked body S2 overlap each other, and the stacked body S1 and the stacked body S2 are disposed closer to each other. As a result, an area of the package in an XY plane can be further reduced.

Next, a manufacturing method of the semiconductor device 1 will be described.

FIGS. 3A to 3E are cross-sectional views showing an example of the manufacturing method of the semiconductor device 1 according to the first embodiment.

First, as shown in FIG. 3A, the stacked body S1 is formed by stacking the plurality of semiconductor chips 10 on the support substrate 2. At this time, one semiconductor chip 10 is bonded onto another semiconductor chip 10 by an adhesive layer 20. The support substrate 2 may be a metal plate such as silicon, glass, ceramic, a resin plate, or a lead frame.

Next, the stacked body S2 is formed by stacking the plurality of semiconductor chips 50 on the support substrate 2. At this time, a semiconductor chip 50 is bonded onto another semiconductor chip 50 by an adhesive layers 60.

Either the stacked body S1 or the stacked body S2 may be formed first. However, when the stacked body S2 higher than the stacked body S1 is formed first, it may be difficult to stack the semiconductor chips 10. Therefore, it is more preferable to form the stacked body S1 first.

Next, the semiconductor chip 200 is stacked on the uppermost semiconductor chip 50. For example, the connection pillars 210 are formed on the electrode pads 205 of the semiconductor chip 200 before the semiconductor chip 200 is provided on the uppermost semiconductor chip 50. The connection pillars 210 are formed by, for example, a plating method. For the material of the connection pillar 210, for example, a conductive metal such as Cu is used.

Next, as shown in FIG. 3B, the columnar electrodes 30, 70 are formed on the semiconductor chips 10, 50, respectively. Metal wires (conductive wires) are bonded onto the electrode pads 15, 55 of the semiconductor chips 10, 50 by the wire bonding method, and the metal wires are drawn out in a direction substantially perpendicular to the first surfaces F10a, F50a to form the columnar electrodes 30, 70. The columnar electrodes 30, 70 are cut at the upper ends, and the columnar electrodes 30, 70 maintain an upright state as they are due to rigidity of the columnar electrodes 30, 70 themselves.

For the columnar electrodes 30, 70, for example, a single substance of Cu, Ni, W, Au, Ag, Pd, Sn, Bi, Zn, Cr, Al, Ti, or Ta, a composite material of two or more of these substances, or an alloy of two or more of these substances is used. Preferably, a material of the columnar electrodes 30, 70 is a single substance of Au, Ag, Cu, or Pd, a composite material of two or more of these substances, and an alloy of two or more of these substances. More preferably, the material of the columnar electrodes 30, 70 is a material having a high hardness among these substances, for example, Cu, a CuPd alloy, and a material in which Cu is covered with Pd. As a result, the columnar electrodes 30, 70 are less likely to bend and collapse when being covered with the resin layer 90.

Next, as shown in FIG. 3C, a structure including the stacked bodies S1, S2, the semiconductor chip 200, the columnar electrodes 30, 70, and the connection pillars 210 is covered with the resin layer 90. For the resin layer 90, for example, a resin such as an epoxy-based resin, a phenol-based resin, a polyimide-based resin, a polyamide-based resin, an pacrylic-based resin, a PBO-based resin, a silicone-based resin, and a benzocyclobutene-based resin, or a mixed material or a composite material of these resins is used. Examples of the epoxy resin include, but are not particularly limited to, a bisphenol-type epoxy resin such as a bisphenol A type resin, a bisphenol F type resin, a bisphenol AD type resin, and a bisphenol S type resin; a novolac type epoxy resin such as a phenol novolac type resin and a cresol novolac type resin; an aromatic epoxy resin such as a resorcinol type epoxy resin and a trisphenolmethane triglycidyl ether; a naphthalene type epoxy resin; a fluorene type epoxy resin; a dicyclopentadiene type epoxy resin; a polyether-modified epoxy resin; a benzophenone type epoxy resin; an aniline type epoxy resin; an NBR modified epoxy resin; a CTBN modified epoxy resin; and a hydrogenated product thereof. Among these resins, the naphthalenetype epoxy resin and the dicyclopentadiene type epoxy resin are preferable since these resins have good adhesion to silicon. The benzophenone type epoxy resin is also preferable since fast curability is easily obtained. These epoxy resins may be used alone or in a combination of two or more thereof. The resin layer 90 may include a filler such as silica.

After the resin layer 90 is formed, the resin layer 90 is heated in an oven or the like, or the resin layer 90 is irradiated with ultraviolet (UV) light to cure the resin layer 90.

Figure 3D:
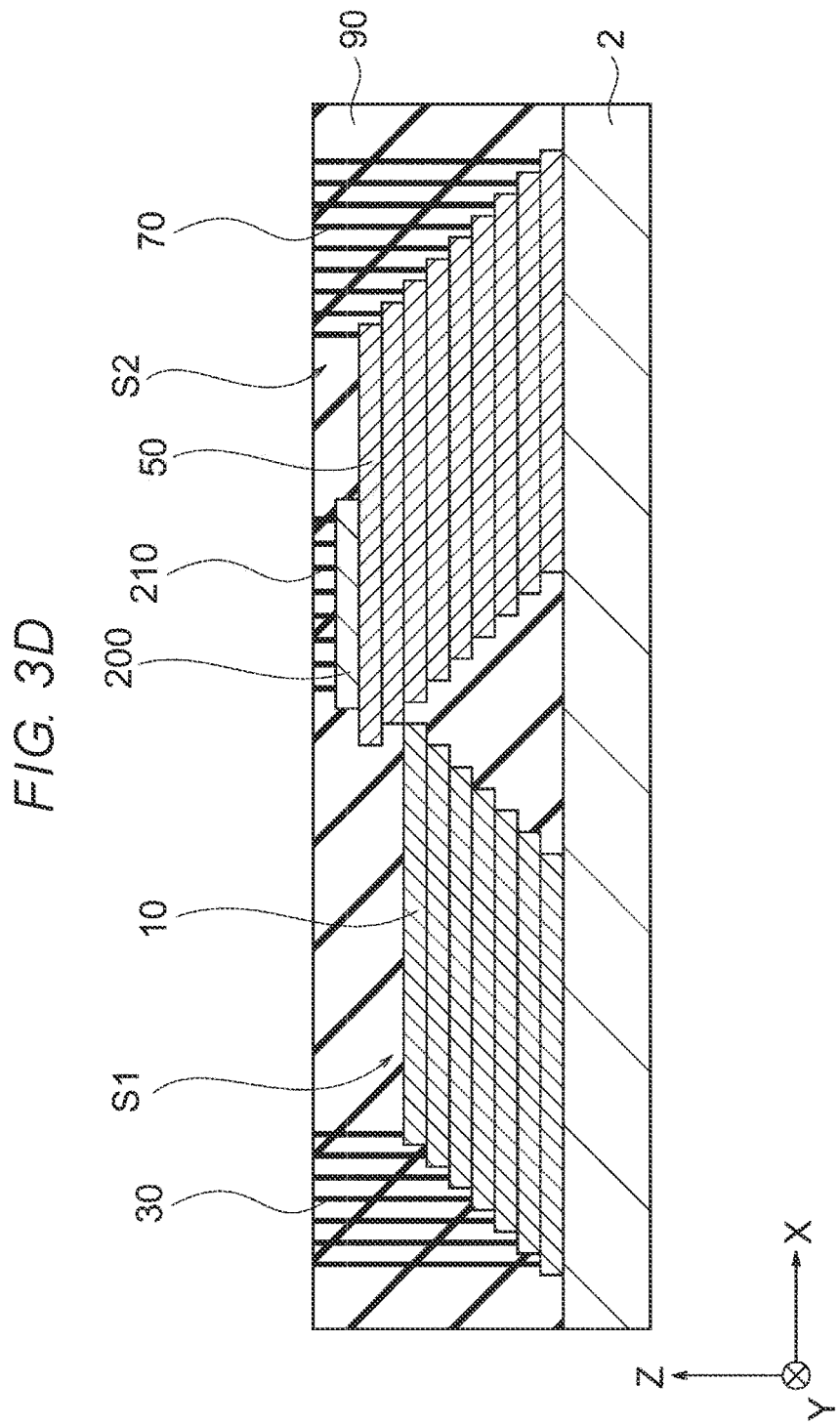
FIG. 3D is a cross-sectional view showing the example of the manufacturing method of the semiconductor device, following FIG. 3C.

Next, as shown in FIG. 3D, the upper surface of the resin layer 90 is ground such that the columnar electrodes 30, 70 and the connection pillars 210 are exposed from the resin layer 90. For example, the resin layer 90 is polished by using a chemical mechanical polishing (CMP) method, a mechanical polishing method, or the like until the columnar electrodes 30, 70 and the connection pillars 210 are exposed.

Next, as shown in FIG. 3E, the redistribution layer 100 is formed on the resin layer 90. For the insulating layers of the redistribution layer 100, for example, a resin such as an epoxy-based resin, a phenol-based resin, a polyimide-based resin, a polyamide-based resin, an acrylic-based resin, a PBO-based resin, a silicone-based resin, a benzocyclobutene-based resin, or a mixed material or a composite material thereof is used. For the wiring layers of the redistribution layer 100, for example, a single substance of Cu, Ni, W, Au, Ag, Pd, Sn, Bi, Zn, Cr, Al, Ti, Ta, TiN, TaN or CrN a composite material of two or more of these substances, or an alloy of two or more of these substances is used.

Next, the support substrate 2 is peeled off by using heat or light such as a laser. Alternatively, the support substrate 2 may be polished to be removed. The adhesive layers 20, 60 provided on the second surfaces F10b, F50b of the lowermost semiconductor chips 10, 50 are also removed.

After the step of FIG. 3E, the metal bumps 150 are formed on the redistribution layer 100. The metal bumps 150 may be formed by using, for example, a ball mounting method, the plating method, or a printing method. For the metal bump 150, for example, a single substance of Sn, Ag, Cu, Au, Pd, Bi, Zn, Ni, Sb, In, or Ge, or a composite film or an alloy of two or more of these substances is used.

Thereafter, the structure and the resin layer 90 obtained in the step of FIG. 3E are diced into individual packages. As a result, the semiconductor device 1 shown in FIG. 1 is obtained.

In the steps of FIGS. 3A and 3B, formation of the stacked body S1, formation of the columnar electrodes 30, formation of the stacked body S2, and formation of the columnar electrodes 70 may be performed in this order.

When there is a margin in a thickness of the package, the support substrate 2 may be left as it is without being removed in the step of FIG. 3E. In this case, the package of the semiconductor device 1 is diced together with the support substrate 2. The support substrate 2 can protect the second surface F10b of the lowermost semiconductor chip 10 and the second surface F50b of the lowermost semiconductor chip 50.

When the support substrate 2 is made of metal or the like, the electromagnetic wave shielding property is improved. Further, the support substrate 2 may be set to the ground potential. In such an embodiment, an adhesive layer is interposed between the support substrate 2 and a lower most chip of the stacked body S1, a lowermost chip of the stacked body S2.

In the above embodiment, the columnar electrodes 30, 70 are formed by the wire bonding method as an example, but may also be formed by the plating method. For example, holes for reaching the electrode pads 15, 55 are formed in the resin layer 90, and then a metal material is embedded in the holes by the plating method. As a result, the columnar electrodes 30, 70 can be formed by the plating method. The columnar electrodes 30, 70 may be formed by using both the plating method and the wire bonding method.

The columnar electrodes 30, 70 according to the present embodiment maybe mixed with wires that are formed by the normal wire bonding method and directly connect the electrode pads of the semiconductor chips. Further, the wires that directly connect the semiconductor chips, the columnar electrodes formed by the wire bonding method, and the columnar electrodes formed by the plating method may be mixed.

As described above, according to the first embodiment, the two stacked bodies S1 and S2 having different heights overlap each other. Accordingly, the two stacked bodies S1 and S2 are disposed closer to each other. As a result, the package can be further reduced in size.

FIG. 4 is a cross-sectional view showing an example of a configuration of a semiconductor device 1a according to a first comparative example.

In the example shown in FIG. 4, a stacked body S1a including 16 stacked semiconductor chips 10a is provided. In the first comparative example, one stacked body Sia is provided. However, in this case, as the number of stacked layers increases, the stacked body S1a becomes higher. Therefore, the package becomes higher in the Z direction.

On the other hand, in the first embodiment, as shown in FIG. 2A, the semiconductor chips 10, 50 are separately stacked in two stacked bodies S1, S2. A height of the package is determined by the height of the higher one of the two stacked bodies S1 and S2. In the example shown in FIG. 2A, the height of the package is determined by the height of the stacked body S2 having nine semiconductor chips 50. Therefore, by dividing the package into the two stacked bodies S1, S2, the height of the package can be further reduced.

FIG. 5 is a cross-sectional view showing an example of a configuration of a semiconductor device 1b according to a second comparative example.

In the example shown in FIG. 5, two stacked bodies S1b, S2b are provided. The two stacked bodies S1b, S2b do not overlap each other as viewed from the stacking direction (Z direction). In this case, as the area of the package, at least respective areas of the stacked bodies S1b, S2b are required.

In contrast, in the first embodiment, the heights of the stacked bodies S1, S2 are different from each other, and the stacked bodies S1, S2 overlap each other. Accordingly, an area of the two stacked bodies S1, S2 as viewed from the stacking direction can be reduced as compared with a sum of the area of the stacked body S1 and the area of the stacked body S2. As a result, the area of the package can be further reduced in size.

In the first embodiment, the semiconductor chip 200 is disposed on the stacked body S2 higher than the stacked body S1. In FIG. 2A, when the semiconductor chip 200 is disposed on the stacked body S1 lower than the stacked body S2, the connection pillars 210 are required to be formed long in order to expose the connection pillars 210 by polishing the resin layer 90. In contrast, in the first embodiment, since the semiconductor chip 200 is disposed on the stacked body S2, the connection pillars 210 to be formed can be further shortened.

In the first embodiment, the columnar electrodes 30 are provided at least for each semiconductor chip 10, and the columnar electrodes 70 are provided at least for each semiconductor chip 50. In the normal wire bonding method, for example, four memory chips are connected by wires, and one of the four memory chips is connected to a substrate via the wires. However, when the semiconductor device 1 is operated at a high speed, it is more preferable that each of the plurality of semiconductor chips is connected to the substrate. When the columnar electrodes are used, each of the plurality of memory chips is easily connected to the substrate without another memory chip interposed therebetween, as compared with the normal wire bonding method. In the first embodiment, the semiconductor chips 10 are connected to the redistribution layer 100 without any other semiconductor chips 10 interposed therebetween, and the semiconductor chips 50 are connected to the redistribution layer 100 without any other semiconductor chips 50 interposed therebetween.

In the first embodiment, the redistribution layer 100 is used as the substrate. The redistribution layer 100 is electrically connected to the columnar electrodes 30, 70 and the connection pillars 210. As described above, when the plurality of memory chips are connected without any other memory chips interposed therebetween, it is required to provide more wirings in the substrate. For both the columnar electrodes 30, 70 and the connection pillars 210, as an interval between the adjacent columnar electrodes becomes narrower, it is required to provide more wirings in the substrate around the columnar electrodes. Accordingly, the number of wiring layers in the substrate increases, and the substrate becomes thick. An increase in the thickness of the package can be obtained. Here, when the redistribution layer 100 is used, a thinner wiring can be obtained as compared with a flip-chip connection to a wiring substrate. Therefore, a wiring density can be improved, and the number of stacked wiring layers can be reduced. As a result, the substrate and the package can be made thinner.

The connection pillars 210 are connected to the electrode pads 205 of the semiconductor chip 200. Instead of the connection pillars 210, columnar electrodes may be connected to the electrode pads 205. However, the smaller a pad pitch of the electrode pads 205 is, the more difficult it is to form the columnar electrodes. Therefore, the columnar electrodes maybe used, but it is more preferable to use the connection pillars 210.

The number of stacked layers of the stacked bodies S1, S2 described above is an example.

Figure 6A:
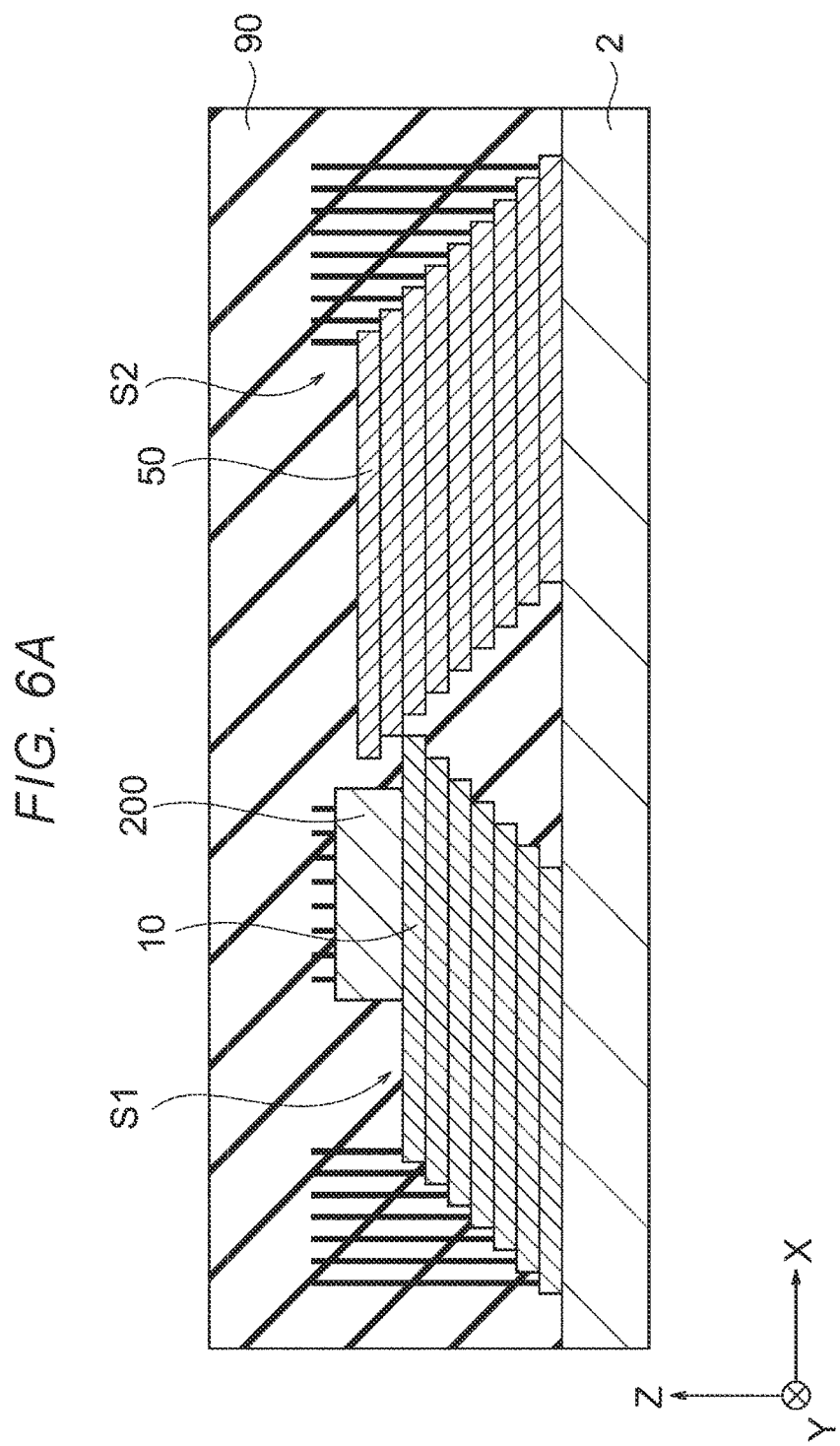
FIG. 6A is a cross-sectional view showing an example of a configuration of a semiconductor device according to a first modification of the first embodiment.

(Modification of First Embodiment)FIG. 6A is a cross-sectional view showing an example of a configuration of the semiconductor device 1 according to a first modification of the first embodiment. FIG. 6B is a plan view showing the example of the configuration of the semiconductor device 1 according to the first modification of the first embodiment. The first modification of the first embodiment is different from the first embodiment in an arrangement of the semiconductor chip 200.

In the example shown in FIG. 6A, the semiconductor chip 200 is disposed on the stacked body S1 lower than the stacked body S2. The semiconductor chip 200 shown in FIG. 6A is thicker than the semiconductor chip 200 shown in FIG. 2A. The semiconductor chip 200 is thicker than, for example, the semiconductor chips 10, 50. Therefore, even when the semiconductor chip 200 is disposed on the stacked body S1, the connection pillars 210 to be formed can be shortened. In the semiconductor chip 200, a semiconductor substrate on the second surface F200b, which is the side opposite to the semiconductor device, is polished and thinned to a desired thickness. In the example shown in FIG. 6A, a polishing amount of the semiconductor substrate of the semiconductor chip 200 is smaller as compared with FIG. 2A.

As shown in FIG. 6B, similarly to FIG. 2B of the first embodiment, the stacked body S2 overlaps at least a part of the stacked body S1 as viewed from the stacking direction (Z direction).

FIG. 7A is a cross-sectional view showing an example of a configuration of the semiconductor device 1 according to a second modification of the first embodiment. The second modification of the first embodiment is different from the first embodiment in the number of stacked semiconductor chips 10, 50.

In the example shown in FIG. 7A, the stacked body S1 includes six stacked semiconductor chips 10. The stacked body S2 includes ten stacked semiconductor chips 50. The stacked body S2 overlaps at least a part of the stacked body S1 as viewed from the stacking direction according to a difference between the height of the stacked body S1 and the height of the stacked body S2.

Since the stacked body S2 of the second modification is higher than the stacked body S2 of the first embodiment, the package becomes high. However, the stacked body S1 of the second modification is lower than the stacked body S1 of the first embodiment. Accordingly, in the second modification, the stacked bodies S1, S2 further overlap each other as compared with the first embodiment. That is, the stacked bodies S1, S2 can be disposed close to each other, and the area of the package can be further reduced. Therefore, when a total number of the semiconductor chips 10, 50 in the package is determined in advance, a ratio between the height and the area of the package can be changed by changing a distribution of the heights of the stacked bodies S1, S2. As a result, a freedom degree in designing package dimensions can be improved.

FIG. 7B is a cross-sectional view showing an example of a configuration of the semiconductor device 1 according to a third modification of the first embodiment. The third modification of the first embodiment is different from the second modification in that the semiconductor chip 200 is disposed on the stacked body S1. Therefore, the third modification is a combination of the first modification and the second modification.

Figure 8A:
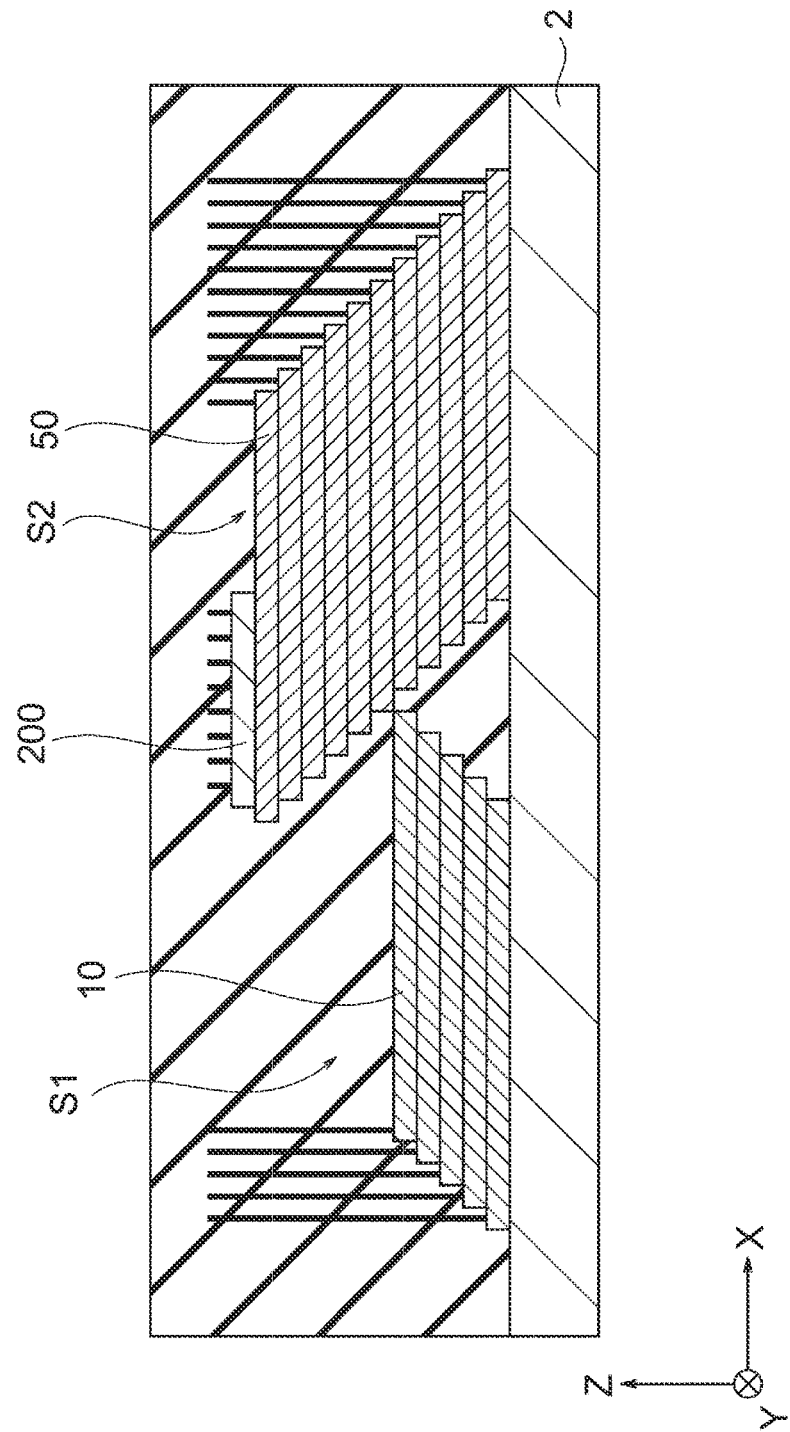
FIG. 8A is a cross-sectional view showing an example of a configuration of a semiconductor device according to a fourth modification of the first embodiment.

FIG. 8A is a cross-sectional view showing an example of a configuration of the semiconductor device 1 according to a fourth modification of the first embodiment. The fourth modification of the first embodiment is different from the first embodiment in the number of stacked semiconductor chips 10, 50.

In the example shown in FIG. 8A, the stacked body S1 includes five stacked semiconductor chips 10. The stacked body S2 includes eleven stacked semiconductor chips 50. Accordingly, in the fourth modification, the stacked bodies S1, S2 further overlap each other as compared with FIG. 7A of the second modification. As a result, the area of the package can be further reduced in size.

FIG. 8B is a cross-sectional view showing an example of a configuration of the semiconductor device 1 according to a fifth modification of the first embodiment. The fifth modification of the first embodiment is different from the fourth modification in that the semiconductor chip 200 is disposed on the stacked body S1. Therefore, the fifth modification is a combination of the first modification and the fourth modification.

FIG. 9A is a cross-sectional view showing an example of a configuration of the semiconductor device 1 according to a sixth modification of the first embodiment. The sixth modification of the first embodiment is different from the first embodiment in the number of stacked semiconductor chips 10, 50.

In the example shown in FIG. 9A, the stacked body S1 includes four stacked semiconductor chips 10. The stacked body S2 includes twelve stacked semiconductor chips 50. Accordingly, in the sixth modification, the stacked bodies S1, S2 further overlap each other as compared with FIG. 8A of the fourth modification. As a result, the area of the package can be further reduced in size.

FIG. 9B is a cross-sectional view showing a configuration of the semiconductor device 1 according to a seventh modification of the first embodiment. The seventh modification of the first embodiment is different from the sixth modification in that the semiconductor chip 200 is disposed on the stacked body S1. Therefore, the seventh modification is a combination of the first modification and the sixth modification.

Figure 10:
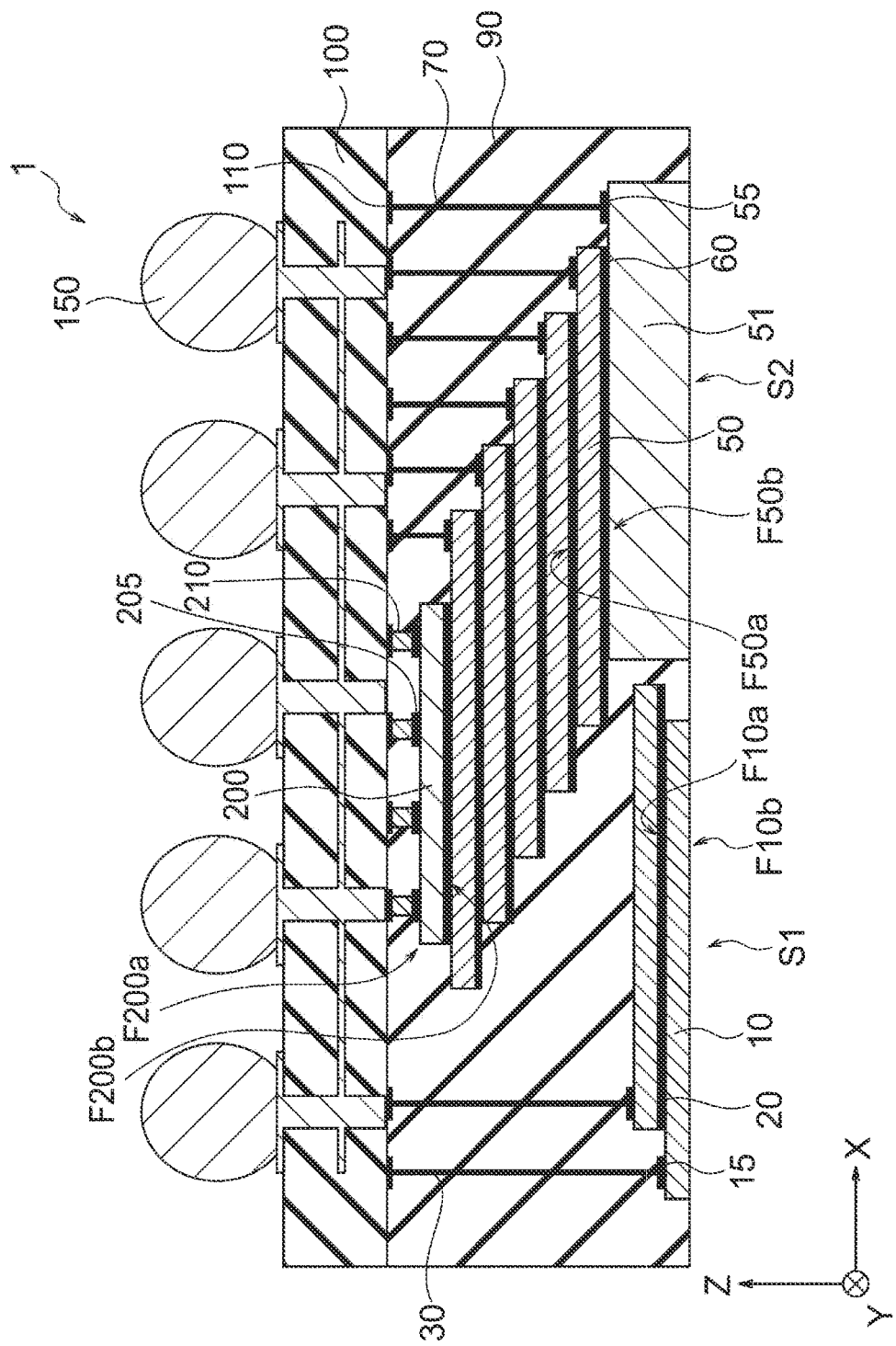
FIG. 10 is a cross-sectional view showing an example of a configuration of a semiconductor device according to a second embodiment.

(Second Embodiment) FIG. 10 is a cross-sectional view showing an example of a configuration of the semiconductor device 1 according to a second embodiment. The second embodiment is different from the first embodiment in that semiconductor chips 50 having different thicknesses are provided.

At least one semiconductor chip 50 is thicker than the other semiconductor chips 50. The at least one semiconductor chip 50 is located at the same position in the stacking direction (Z direction) as at least one semiconductor chip 10. In the example shown in FIG. 10, the lowermost semiconductor chip 50 is thicker than the other semiconductor chips 50. Hereinafter, the lowermost semiconductor chip 50 is referred to as a semiconductor chip 51 in distinction from the other semiconductor chips 50. The stacked body S2 overlaps at least a part of the stacked body S1 as viewed from the stacking direction according to a thickness of the semiconductor chip 51. When the thickness of the semiconductor chip 51 is increased, the stacked body S1 is more likely to get under the stacked body S2. That is, the stacked body S1 can be closer to the semiconductor chip 51. Therefore, the stacked bodies S1, S2 can be further overlapped with each other. As a result, the area of the package can be further reduced in size.

Since the other configurations of the semiconductor device according to the second embodiment is the same as the corresponding configurations of the semiconductor device 1 according to the first embodiment, a detailed description thereof will be omitted. The semiconductor device 1 according to the second embodiment can obtain the same effects as those of the first embodiment. The semiconductor device 1 according to the second embodiment may be combined with the first to seventh modifications of the first embodiment.

Figure 11:
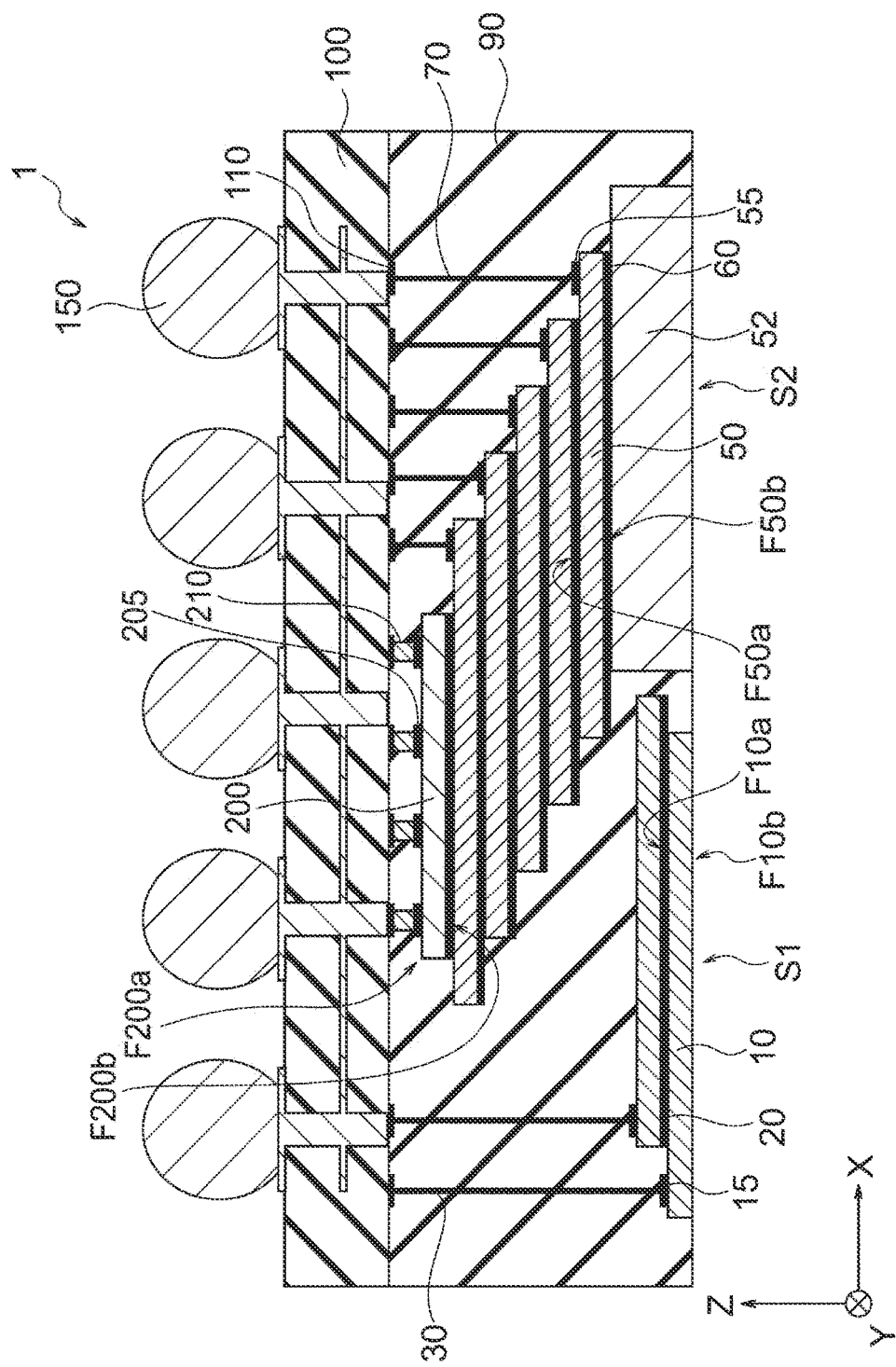
FIG. 11 is a cross-sectional view showing an example of a configuration of a semiconductor device according to a modification of the second embodiment.

(Modification of Second Embodiment)FIG. 11 is a cross-sectional view showing an example of a configuration of the semiconductor device 1 according to a modification of the second embodiment. The second embodiment is different from the first embodiment in that a spacer 52 is provided instead of the thick semiconductor chip 51.

The stacked body S2 includes the spacer 52. The semiconductor chips 50 are stacked on the spacer 52, and the spacer 52 is thicker than the semiconductor chips. In this case, since the thick semiconductor chip 51 is not provided, all the semiconductor chips in the stacked body S2 can have the same thickness. Silicon, for example, is used for a material of the spacer 52.

Figure 12:
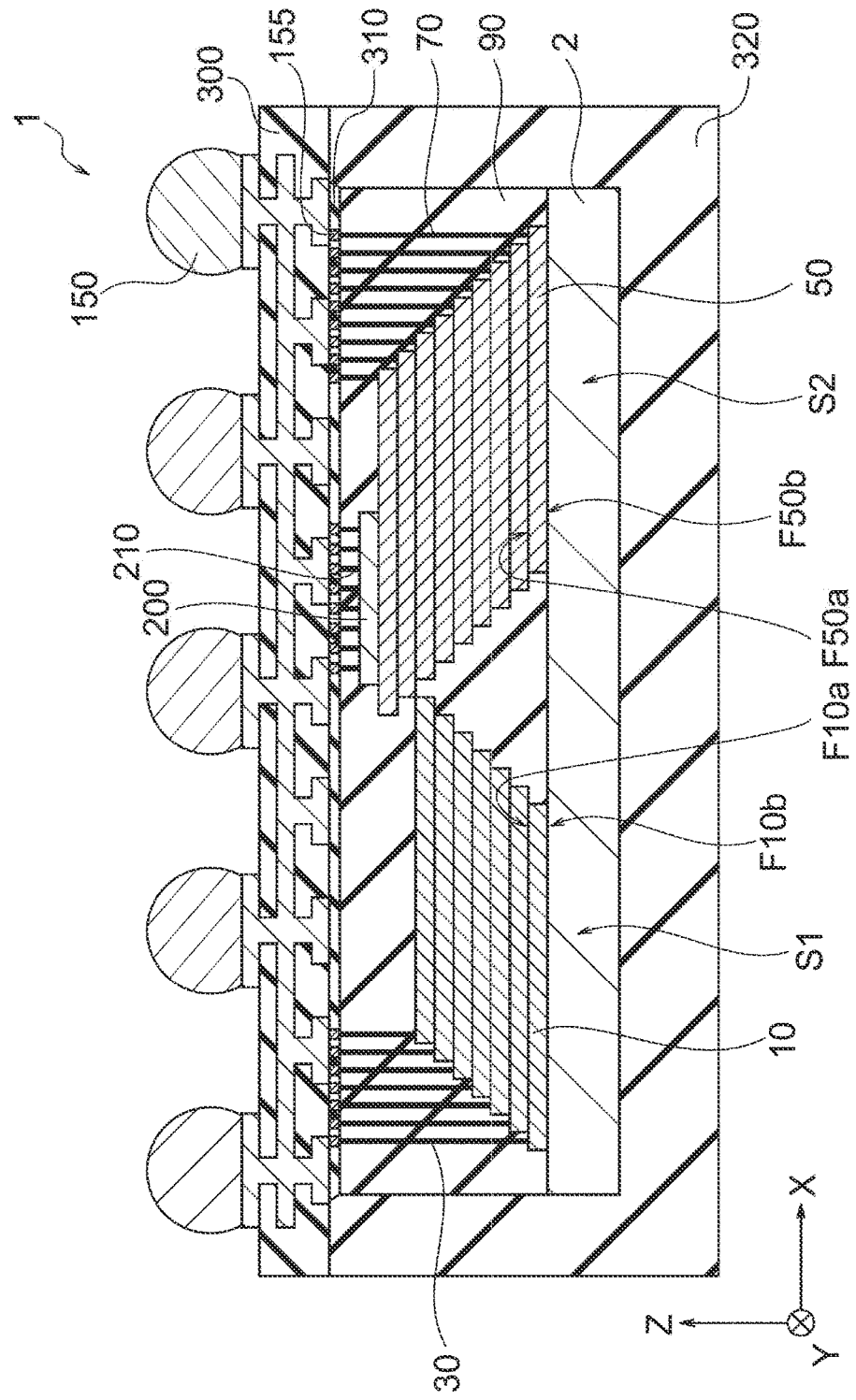
FIG. 12 is a cross-sectional view showing an example of a configuration of a semiconductor device according to a third embodiment.

(Third Embodiment)FIG. 12 is a cross-sectional view showing an example of a configuration of the semiconductor device 1 according to a third embodiment. The third embodiment is different from the first embodiment in that a flip-chip connection to a wiring substrate 300 is used instead of the redistribution layer 100.

The semiconductor device 1 does not include the redistribution layer 100, and further includes metal bumps 155, the wiring substrate 300, a resin layer 310, and a resin layer 320.

The metal bumps (connection bumps) 155 are provided on upper end portions of the columnar electrodes 30, 70 and the connection pillars 210. A material of the metal bumps 155 may be the same as the material of the metal bumps 150. That is, for the metal bumps 155, for example, a conductive metal such as a single substance of Sn, Ag, Cu, Au, Pd, Bi, Zn, Ni, Sb, In, or Ge, or a composite film or an alloy of two or more of these substances is used.

The wiring substrate 300 is a multilayer substrate including a wiring layer and an insulating layer. The insulating layer is, for example, a prepreg. The insulating layer is, for example, a composite material of a fibrous reinforcing material such as glass cloth and a thermosetting resin such as epoxy.

The wiring substrate 300 is electrically connected to the columnar electrodes 30, 70 via the metal bumps 155. For example, when intervals between adjacent columnar electrodes are wide, the redistribution layer 100 is not necessary. As a result, a step of mounting the redistribution layer 100 is not required. Since the redistribution layer 100 is not required, a cost of the semiconductor device 1 is reduced. FIG. 12 schematically shows the wiring layer in the wiring substrate 300.

The resin layer 310 seals between the resin layer 90 and the wiring substrate 300. The resin layer 310 may be used for bonding the resin layer 90 and the wiring substrate 300.

The resin layer 320 covers the entire resin layer 90. When the support substrate 2 is peeled off, the resin layer 320 covers and protects the second surfaces F10b, F50b of the semiconductor chips 10, 50 exposed from the resin layer 90.

Next, a manufacturing method of the semiconductor device 1 will be described.

FIGS. 13A to 13D are cross-sectional views showing an example of the manufacturing method of the semiconductor device 1 according to the third embodiment. FIGS. 13A to 13D show steps after polishing of the resin layer 90 in FIG. 3D of the first embodiment.

Figure 13A:
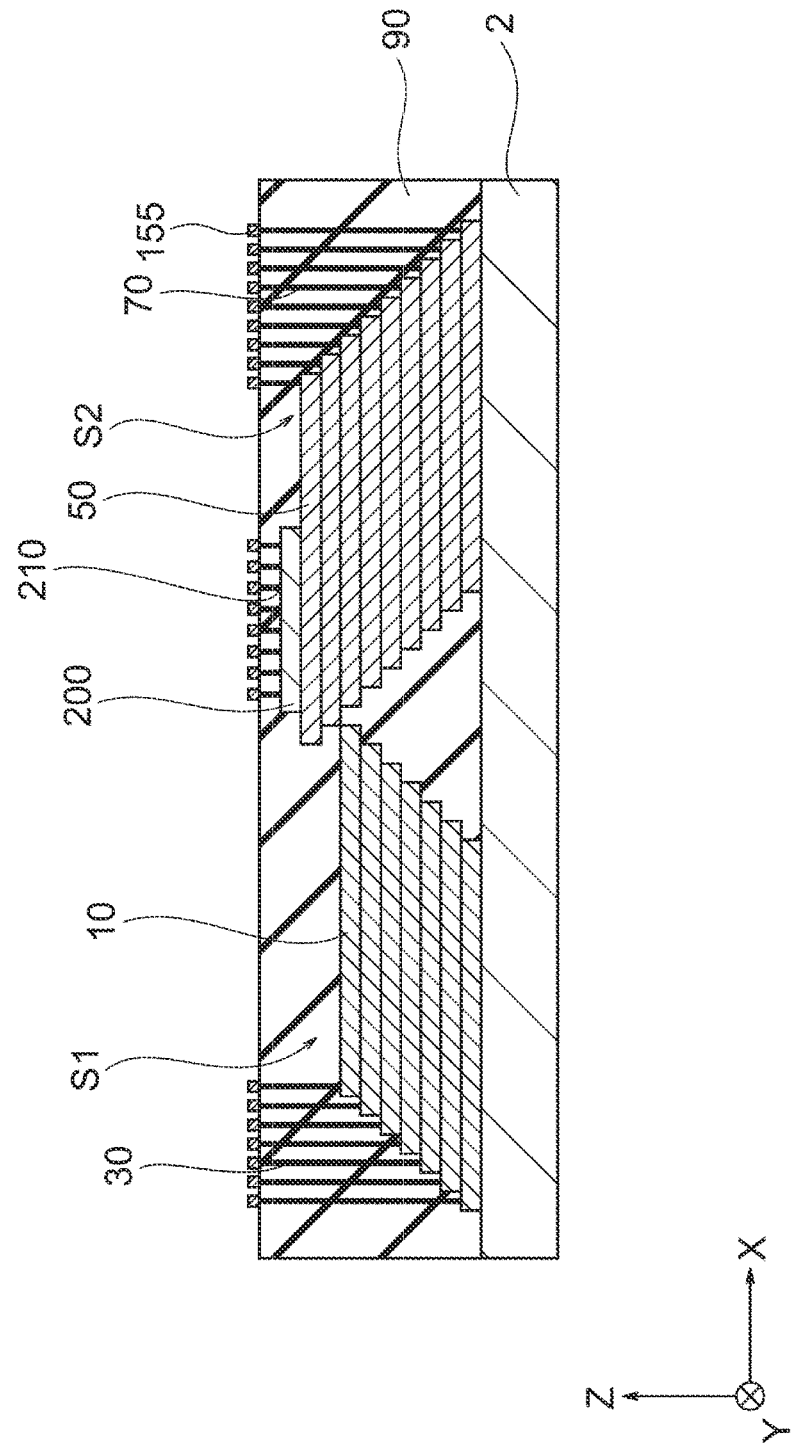
FIG. 13A is a cross-sectional view showing an example of a manufacturing method of the semiconductor device according to the third embodiment.

After the step of FIG. 3D, as shown in FIG. 13A, the metal bumps 155 are formed on the upper end portions of the columnar electrodes 30, 70.

Next, the structure and the resin layer 90 obtained in the step of FIG. 13A are diced into individual packages.

Next, as shown in FIG. 13B, a material 310a of the resin layer 310 is applied onto the wiring substrate 300.

Figure 13C:
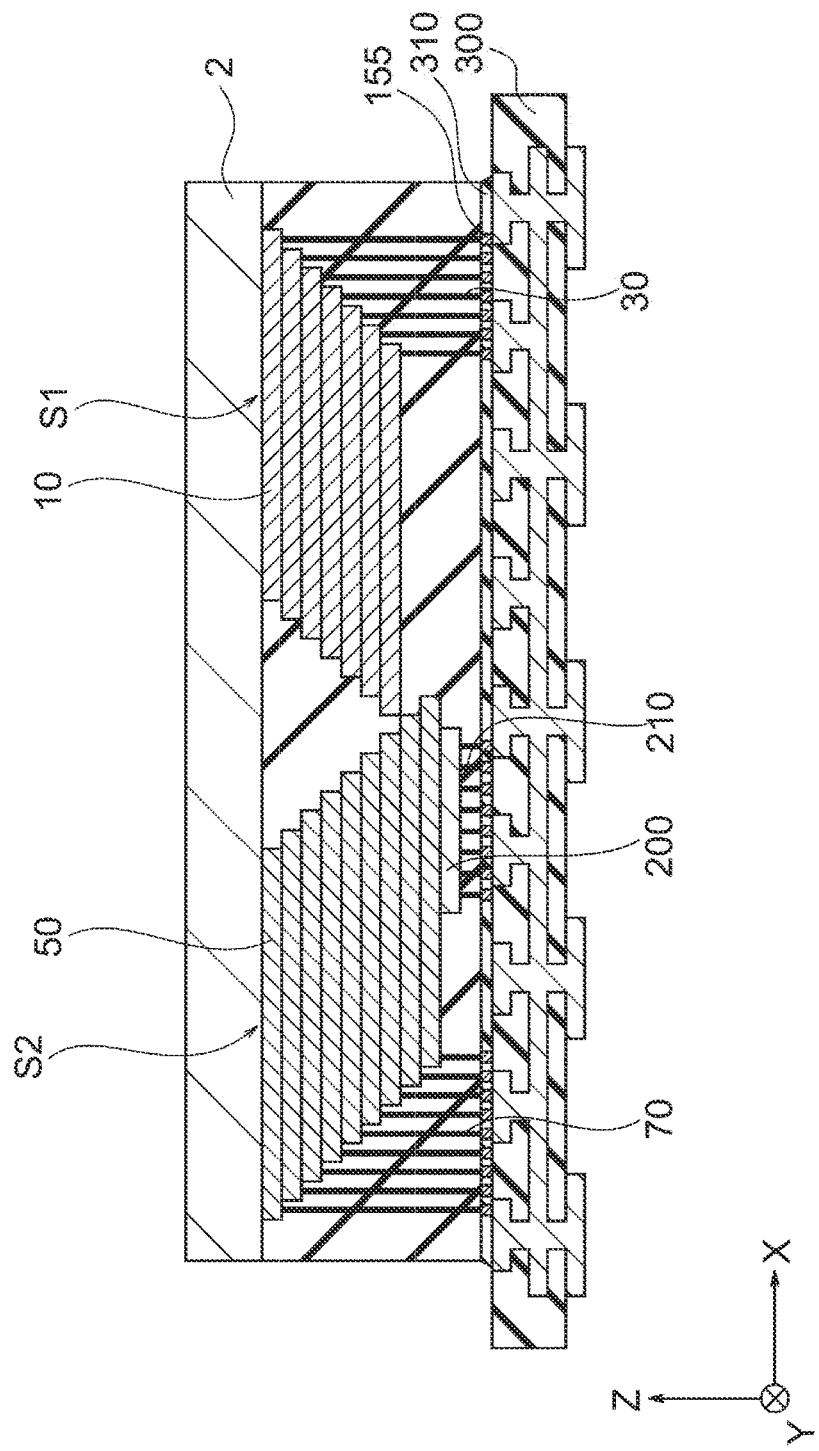
FIG. 13C is a cross-sectional view showing the example of the manufacturing method of the semiconductor device, following FIG. 13B.

Next, as shown in FIG. 13C, the resin layer 90 is mounted on the wiring substrate 300. That is, the resin layer 90 is bonded to the wiring substrate 300, and the columnar electrodes 30, 70 and the connection pillars 210 are electrically connected to the wiring substrate 300 via the metal bumps 155.

Figure 13D:
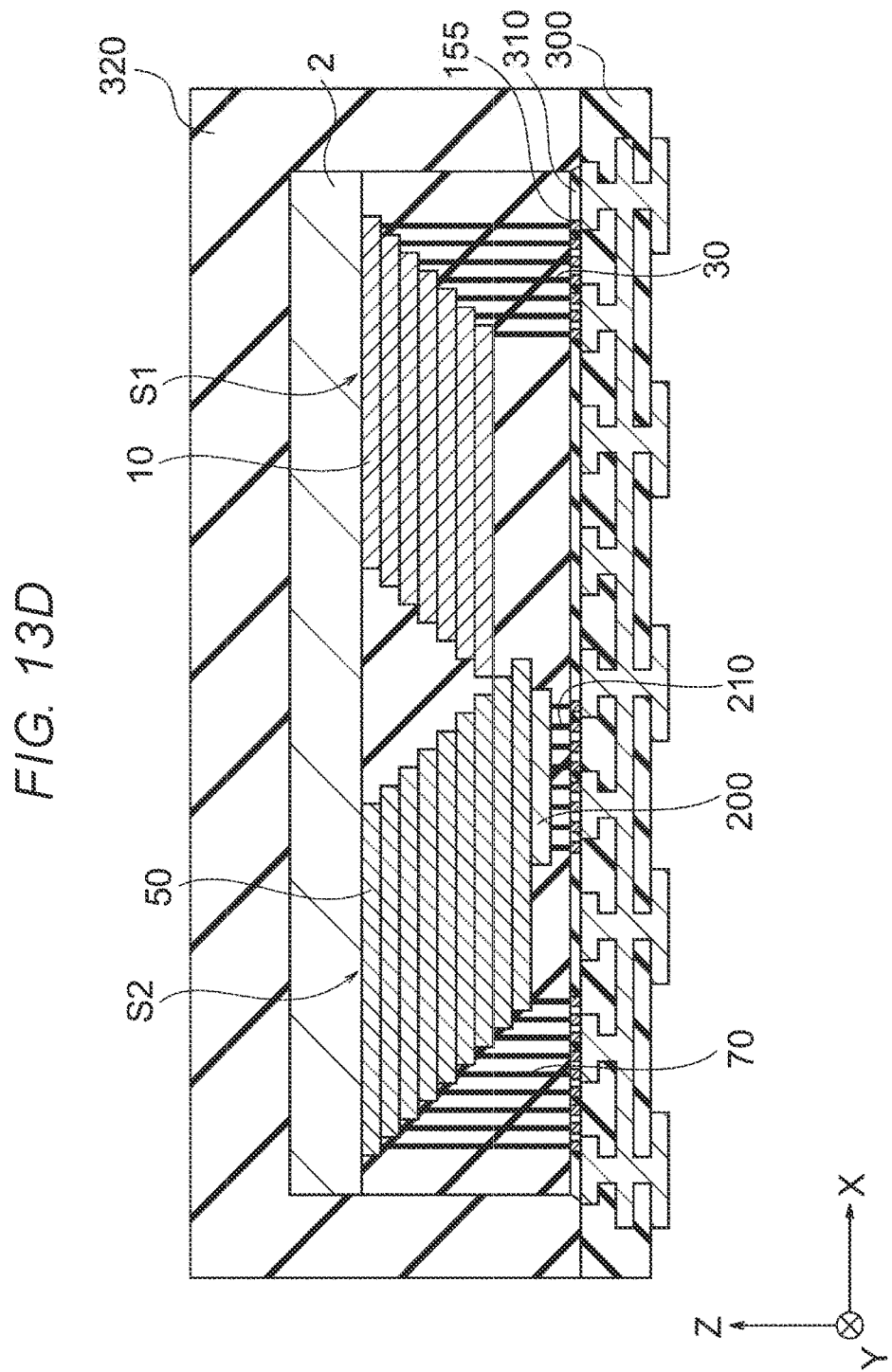
FIG. 13D is a cross-sectional view showing the example of the manufacturing method of the semiconductor device, following FIG. 13C.

Next, as shown in FIG. 13D, the support substrate 2 and the resin layers 90, 310 are covered with the resin layer 320.

Thereafter, the metal bumps 150 are formed on the wiring substrate 300, thereby completing the semiconductor device 1 shown in FIG. 12.

Since the other configurations of the semiconductor device according to the third embodiment is the same as the corresponding configurations of the semiconductor device 1 according to the first embodiment, a detailed description thereof will be omitted. The semiconductor device 1 according to the third embodiment can obtain the same effects as those of the first embodiment. The semiconductor device 1 according to the third embodiment may be combined with the first to seventh modifications of the first embodiment. The semiconductor device 1 according to the third embodiment may be combined with the second embodiment and the modification of the second embodiment.

Figure 14:
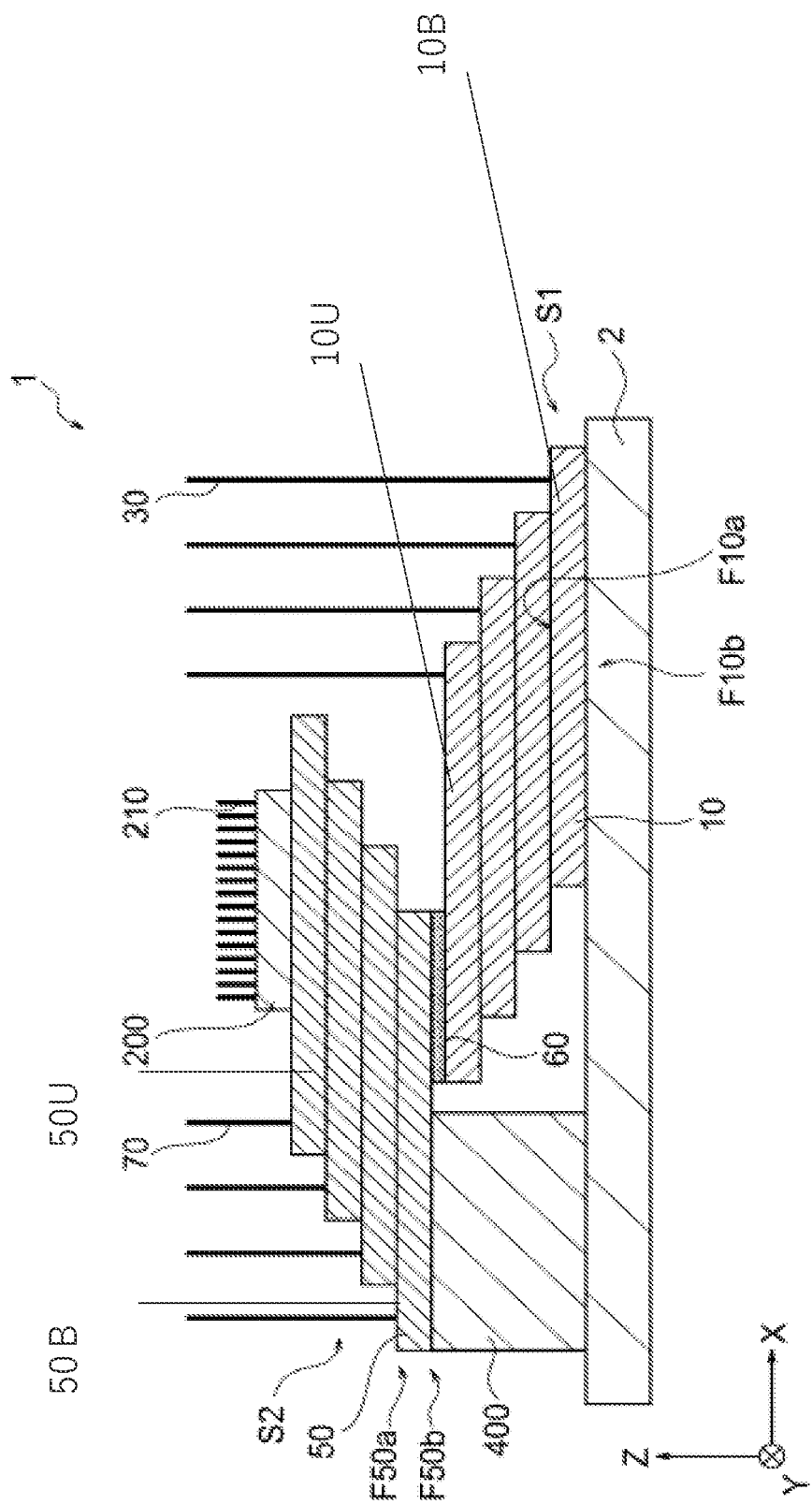
FIG. 14 is a cross-sectional view showing an example of a configuration of a semiconductor device according to a fourth embodiment.

(Fourth Embodiment)FIG. 14 is a cross-sectional view showing an example of a configuration of the semiconductor device 1 according to a fourth embodiment. The fourth embodiment is different from the first embodiment in that the semiconductor chips are stacked in a turning back state. In FIG. 14, the resin layer 90, the redistribution layer 100, and the like are omitted.

In the fourth embodiment, the arrangement of the stacked bodies S1, S2 is different from those of the first embodiment. The semiconductor device 1 further includes a spacer 400.

The stacked body S1 includes, for example, four stacked semiconductor chips 10. The semiconductor chips 10 of the stacked body S1 are stacked so as to be deviated toward the spacer 400 (-X direction).

The columnar electrodes 30 are connected to the electrode pads 15 (not shown) of the semiconductor chips 10, and extend in the stacking direction (Z direction) of the semiconductor chips 10.

The semiconductor chips 10 of the stacked body S1 are stacked so as to be deviated toward the spacer 400, thereby exposing the electrode pads 15. The columnar electrodes 30 are connected to the electrode pads 15, which are disposed on a side opposite to the spacer 400 on the first surfaces F10a.

The spacer 400 is provided on the support substrate 2 similarly to the stacked body S1. Therefore, the spacer 400 is disposed on the same plane as the second surface F10b of the lowermost semiconductor chip 10. The spacer 400 is disposed in parallel with the stacked body S1 in the direction perpendicular to the stacking direction. A height of the spacer 400 is equal to or greater than the height of the stacked body S1. The spacer 400 functions as a pedestal that supports the stacked body S2. For example, silicon is used for a material of the spacer 400.

The stacked body S2 is disposed on the stacked body S1 and the spacer 400. The stacked body S2 includes, for example, four stacked semiconductor chips 50. The semiconductor chips 50 of the stacked body S2 are stacked so as to be deviated towards the direction (X direction) opposite to the direction of the deviation of the stacked body S1. The stacked body S2 is separated from the columnar electrodes 30 so as not to be in contact with the columnar electrodes 30. Therefore, it is more preferable that the stacked body S2 is disposed not on a stacked body S1 side but on a spacer 400 side. The second lowermost layer chip 50B is provided on the first uppermost layer chip 10U. The second bottom layer chip 50B is provided on the spacer 400. In this case, since an area in which the stacked body S2 and at least a part of the spacer 400 are in contact with each other is increased, the spacer 400 can more stably support the stacked body S2.

The uppermost semiconductor chip 10 and the lowermost semiconductor chip 50 are in contact with each other via, for example, the adhesive layer 60. By filling a difference between a thickness of the spacer 400 and the height of the stacked body S1 with the adhesive layer 60, the lowermost semiconductor chip 50 can be provided substantially horizontally. For example, it is more preferable that the adhesive layer 60 attached to the lowermost semiconductor chip 50 is thicker than the adhesive layers 60 attached to the other semiconductor chips 50. A thickness of the adhesive layer 60 of the lowermost semiconductor chip 50 is, for example, about 10 μm to about 20 μm. Thicknesses of the adhesive layers 60 of the other semiconductor chips 50 are, for example, about 5 μm.

The columnar electrodes 70 are connected to the electrode pads 55 (not shown) of the semiconductor chips 50, and extend in the stacking direction (Z direction) of the semiconductor chips 50.

The semiconductor chips 50 of the stacked body S2 are stacked so as to be deviated toward the columnar electrodes 30, thereby exposing the electrode pads 55. The columnar electrodes 70 are connected to the electrode pads 55, which are disposed on a side opposite to the columnar electrodes 30 on the first surfaces F50a.

The semiconductor chip 200 is disposed on the stacked body S2. The semiconductor chip 200 is disposed between the columnar electrodes 30 and the columnar electrodes 70. The semiconductor chip 200 is disposed at a substantial center portion of regions of the stacked body S1 and the stacked body S2 as viewed from the stacking direction. As a result, the semiconductor chip 200 can be disposed at a substantial center of the package. The semiconductor chip 200 partially overlaps the first lowermost layer chip 10B, the first uppermost layer chip 10U, the second lowermost layer chip 50B, and the second uppermost layer chip 50U when viewed from the stacking direction. The semiconductor chip 200 partially overlaps all the semiconductor chips of the stacked body S1 and the stacked body S2 when viewed from the stacking direction.

The connection pillars 210 are connected to the electrode pads 205 (not shown) of the semiconductor chip 200 and extend in the stacking direction.

Next, a manufacturing method of the semiconductor device 1 will be described.

In the example shown in FIG. 14, it is more preferable to form the columnar electrodes 30 before formation of the stacked body S2. When the columnar electrodes 30 are formed after the formation of the stacked body S2, a capillary may interfere with the stacked body S2, and thus it is required to widen an interval between the stacked body S2 and the columnar electrodes 30. This leads to an increase in the package area.

In FIG. 4 of the first comparative example, the semiconductor chip 200a is disposed on the stacked body S1a which is stacked so as to be deviated toward one direction. Therefore, the semiconductor chip 200a is easily disposed at an end portion of the package, and is difficult to be disposed at the substantial center of the package. The columnar electrodes 30a are disposed in a manner concentrated on one side of the semiconductor chip 200a. Accordingly, a variation in a wiring length from each semiconductor chip 10a to the semiconductor chip 200a increases.

This leads to an increase in a variation in electrical characteristics among the semiconductor chips 10a. A length of the columnar electrode is shorter than a length of the wiring in the redistribution layer 100a, and has a smaller influence on the wiring length. For example, the lower the semiconductor chip 10a is, the longer the wiring length to the semiconductor chip 200a is. Similarly, a variation in a wiring length between a terminal of an external device on which the semiconductor device 1a is mounted and the semiconductor chip 200a increases, and the wiring length becomes long. This leads to an obstacle of speeding up of the semiconductor device 1a. As the semiconductor chip 200 is farther from the center of the package, routing of the wiring is more likely to be concentrated, and thus the number of wiring layers of the redistribution layer 100 is more likely to be increased. The connection pillars 210a connected to the semiconductor chip 200a may be disposed at a higher density than that of the columnar electrodes 30a, and an influence on the routing of the wiring is more likely to be large.

With respect to the above, in the fourth embodiment, since the semiconductor chip 200 is provided on the stacked body S2 deviated and stacked so as to turn back from the stacked body S1, the semiconductor chip 200 can be easily disposed at the substantial center of the package. The columnar electrodes 30, sandwich the connection pillars 210 from both sides. Accordingly, it is possible to prevent a variation between wiring lengths from the semiconductor chip 200 to the semiconductor chips 10 and wiring lengths from the semiconductor chip 200 to the semiconductor chips 50. The wiring lengths from the semiconductor chip 200 to the semiconductor chips 10, 50 can be further shortened. Therefore, it is possible to prevent variations in electrical characteristics among the semiconductor chips 10, 50. Similarly, a variation in a wiring length between the external device and the semiconductor chip 200 can be prevented, and the wiring length can be shortened. It is possible to distribute the routing of the wiring, and it is possible to prevent the increase in the number of wiring layers of the redistribution layer 100. Therefore, the wiring length and the routing of the wiring can be set more appropriately.

The spacer 400 can prevent an influence of an accumulated tolerance of the height of the stacked body S1. Normally, as the number of stacked semiconductor chips increases, it is required to form the columnar electrodes longer inconsideration of an accumulated tolerance of the semiconductor chips. However, since the columnar electrodes are scrapped when the resin layer is polished, it is desirable that the columnar electrodes are not formed longer than a required length. For this reason, in the fourth embodiment, the columnar electrodes 30, 70 and the connection pillars 210 having lengths corresponding to an accumulated tolerance of the height of the stacked body S2 provided on the spacer 400 are formed. That is, it is not required to consider the accumulated tolerance of the height of the stacked body S1 lower than the spacer 400. Therefore, it is possible to further shorten the columnar electrodes 30, 70 and the connection pillars 210 to be formed.

The spacer 400 can prevent an increase in a thickness of the lowermost semiconductor chip 50. In a case where the spacer 400 is not provided, when wires are applied to the turning-back semiconductor chip by the normal wire bonding, the turning-back semiconductor chip may be broken. This is because an interval between the semiconductor chip and the support substrate at a position of the electrode pads is hollow, so that strength of the semiconductor chips becomes weak. When the thickness of the turning-back semiconductor chip (the lowermost semiconductor chip 50) is increased in order to secure the strength of the semiconductor chips, the package becomes thick. When the stacked body S2 is brought close to a columnar electrode 30 side in order to prevent the semiconductor chips 50 from being broken, the stacked body S2 may interfere with the columnar electrodes 30. With respect to the above, in the fourth embodiment, since the spacer 400 supports the lowermost semiconductor chip 50, it is not required to increase the thickness of the lowermost semiconductor chip 50.

The stacked body S1 maybe a single semiconductor chip 10, and the stacked body S2 may be a single semiconductor chip 50.

Figure 15:
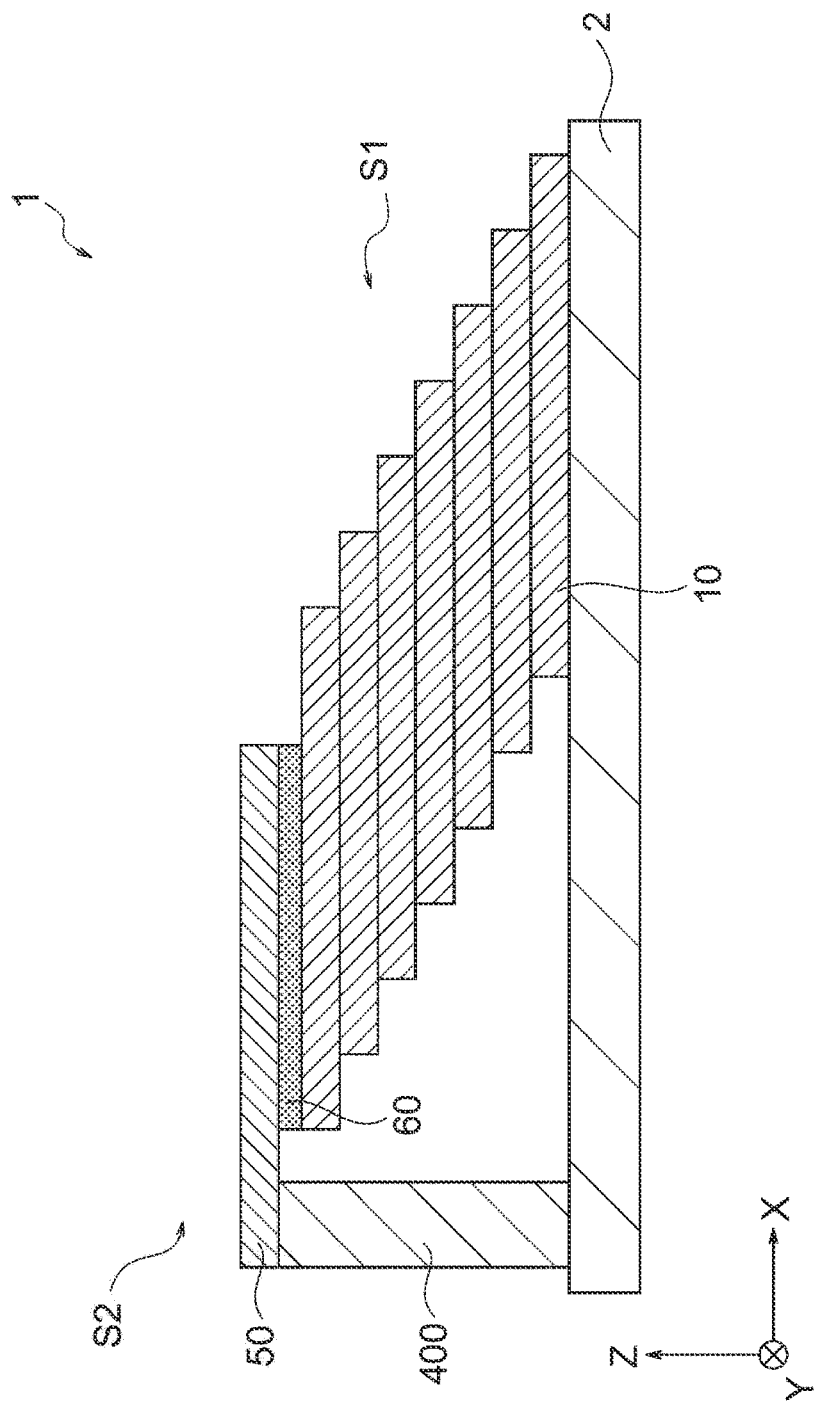
FIG. 15 is a cross-sectional view showing an example of a configuration of a semiconductor device according to a first modification of the fourth embodiment.

(Modification of Fourth Embodiment)FIG. 15 is a cross-sectional view showing an example of a configuration of the semiconductor device 1 according to a first modification of the fourth embodiment. The first modification of the fourth embodiment is different from the fourth embodiment in that the semiconductor chips are stacked so as to be deviated toward one direction.

In the example shown in FIG. 15, the stacked body S1 includes seven stacked semiconductor chips 10. The stacked body S2 includes one semiconductor chip 50. In this case, it is not required to consider the accumulated tolerance of the height of the stacked body S1. Therefore, the number of stacked layers of the stacked bodies S1, S2 may be changed.

Figure 16:
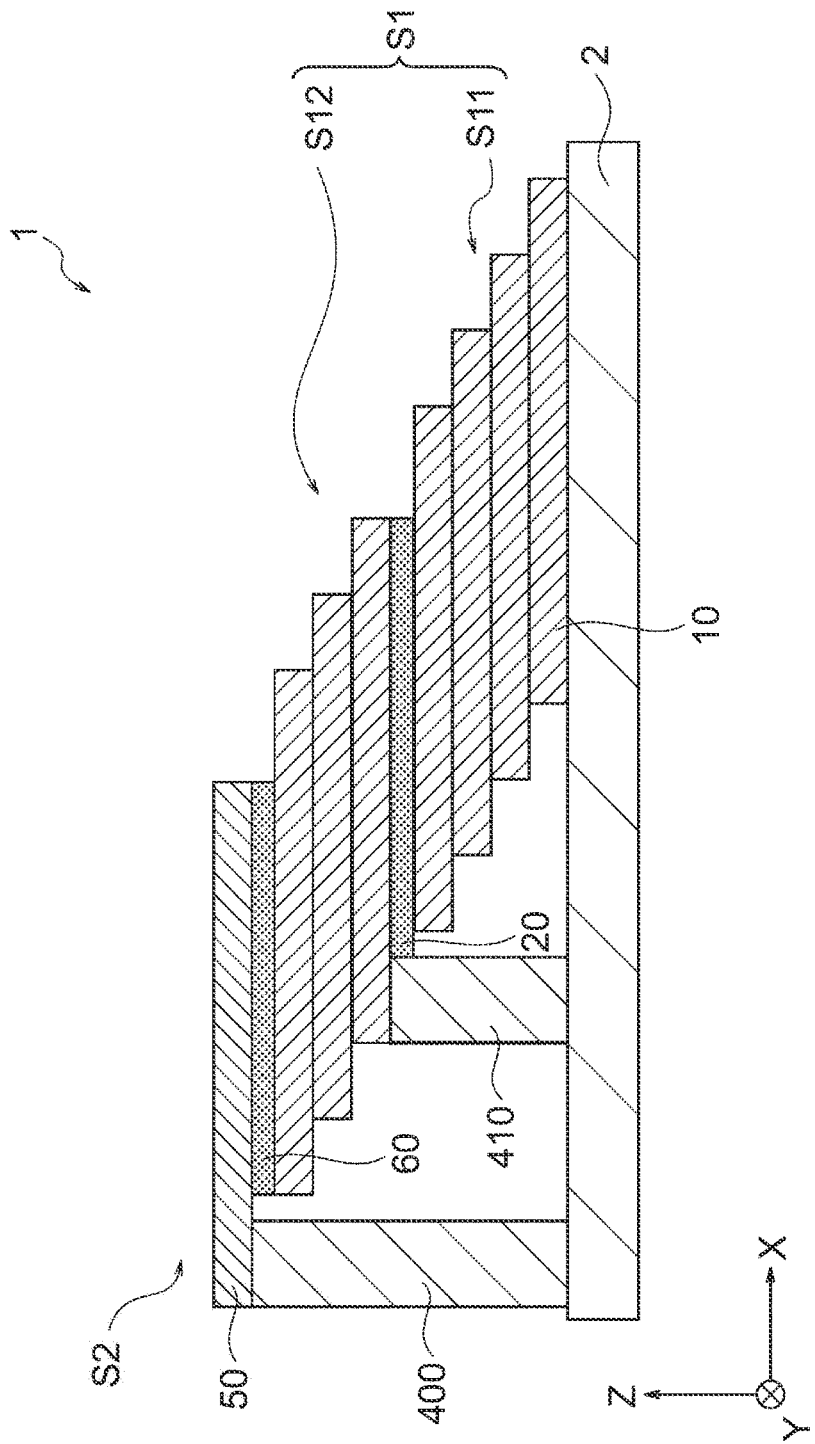
FIG. 16 is a cross-sectional view showing an example of a configuration of a semiconductor device according to a second modification of the fourth embodiment.

FIG. 16 is a cross-sectional view showing an example of a configuration of the semiconductor device 1 according to a second modification of the fourth embodiment. The second modification of the fourth embodiment is different from the first modification of the fourth embodiment in that a plurality of spacers are provided.

In the example shown in FIG. 16, the stacked body S1 includes a stacked body S11 and a stacked body S12. The stacked body S11 includes four stacked semiconductor chips 10. The stacked body S12 includes three stacked semiconductor chips 10.

The semiconductor device 1 further includes a spacer 410. The spacer 410 is provided in the middle of stacking the stacked body S1. The spacer 410 is disposed in parallel with the stacked body S11 in a direction perpendicular to the stacking direction, and supports the stacked body S12. In this way, the number of spacers may be changed.

Figure 17:
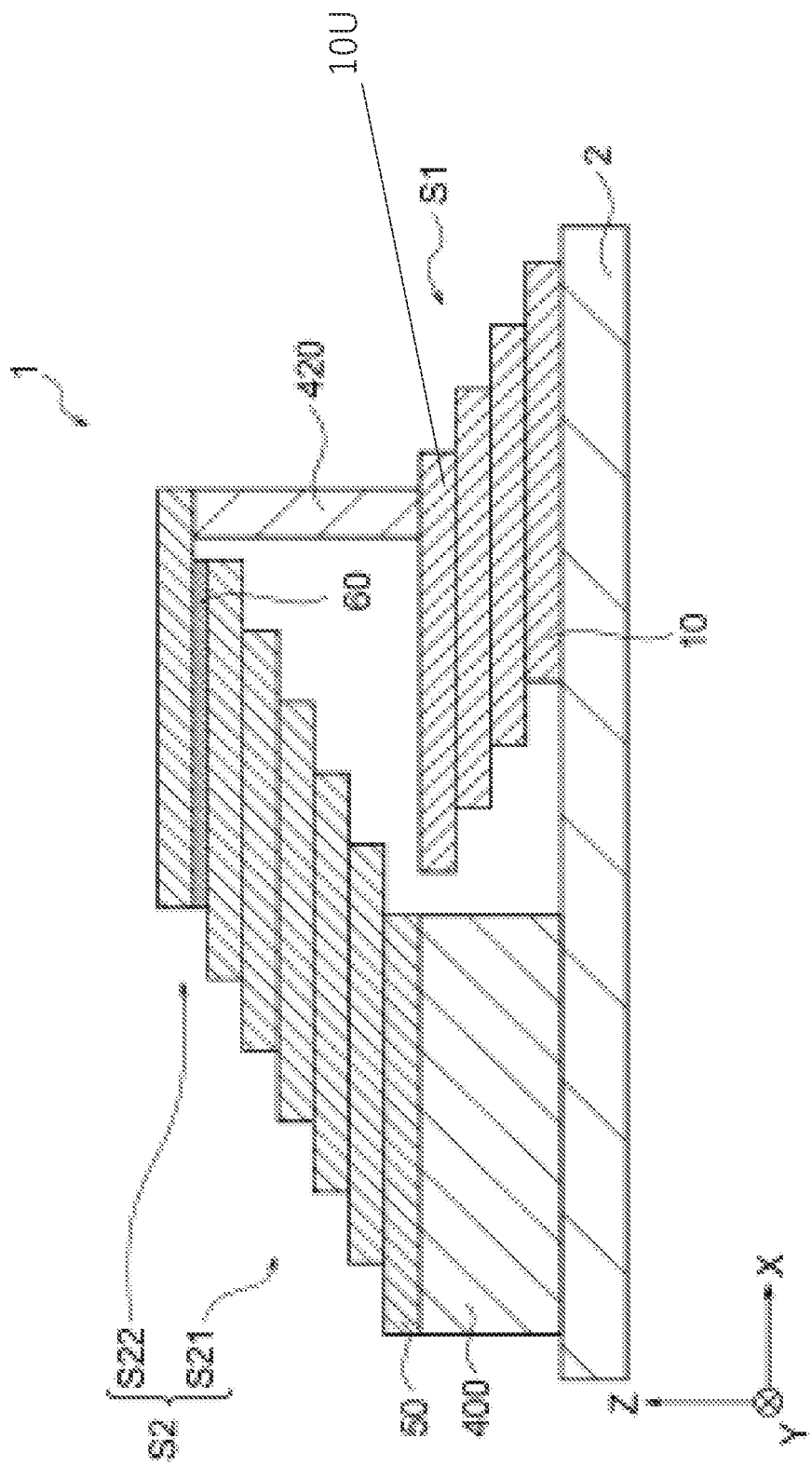
FIG. 17 is a cross-sectional view showing an example of a configuration of a semiconductor device according to a third modification of the fourth embodiment.

FIG. 17 is a cross-sectional view showing an example of a configuration of the semiconductor device 1 according to a third modification of the fourth embodiment. In the third modification of the fourth embodiment, similarly to the fourth embodiment, the stacked body S1 and the stacked body S2 are stacked while being deviated in opposite directions from each other. The third modification of the fourth embodiment is different from the fourth embodiment in that a plurality of spacers are provided.

In the example shown in FIG. 17, the stacked body S2 is disposed above the stacked body S1, but the lowermost semiconductor chip 50 is not in contact with the semiconductor chips 10 of the stacked body S1.

The stacked body S2 includes a stacked body S21 and a stacked body S22. The stacked body S21 includes six stacked semiconductor chips 50. The stacked body S22 includes one semiconductor chip 50 on an upper side.

The semiconductor device 1 further includes a spacer 420. The spacer 420 is provided in the middle of stacking the stacked body S2. The spacer 420 is provided on the uppermost layer chip 10U of the stacked body S1. The spacer 420 is disposed in parallel with the stacked body S21 in the direction perpendicular to the stacking direction, and supports the stacked body S22. In this way, the number of spacers may be changed.

Figure 18:
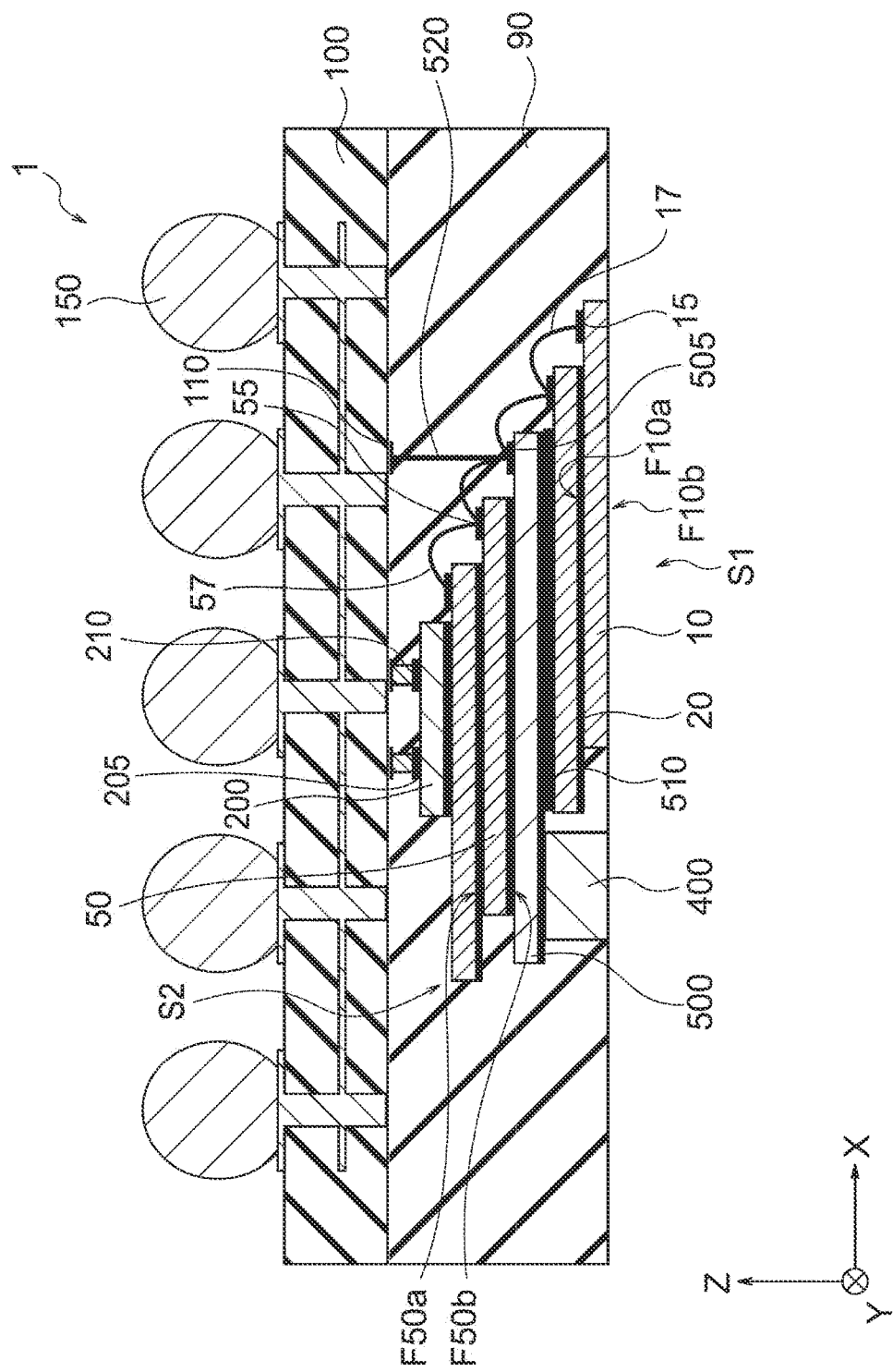
FIG. 18 is a cross-sectional view showing an example of a configuration of a semiconductor device according to a fifth embodiment.

(Fifth Embodiment)FIG. 18 is a cross-sectional view showing an example of a configuration of the semiconductor device 1 according to a fifth embodiment. The fifth embodiment is different from the first embodiment in that a dummy chip to which columnar electrodes are connected is provided. The columnar electrodes are mixed with wires that are formed by the normal wire bonding method and that directly connect the electrode pads of the semiconductor chips.

The semiconductor device 1 includes wires 17, 57, the spacer 400, a dummy chip 500, an adhesive layer 510, and columnar electrodes 520.

The stacked body S1 includes two stacked semiconductor chips 10. The semiconductor chips 10 of the stacked body S1 are stacked so as to be deviated toward the direction perpendicular to the stacking direction. The columnar electrodes are not connected to the semiconductor chip 10.

The electrode pads 15 of the two semiconductor chips 10 are connected with each other by the wires 17. The wires 17 connect the electrode pads 15 of the semiconductor chips 10 and electrode pads 505 of the dummy chip 500. The wires 17 are formed by the normal wire bonding method. For a material of the wires 17, for example, a conductive metal such as Au is used.

The stacked body S2 includes two stacked semiconductor chips 50. The semiconductor chips 50 of the stacked body S2 are stacked so as to be deviated toward a direction perpendicular to the stacking direction. The stacked body S2 is disposed above the stacked body S1. No columnar electrodes are connected to the semiconductor chips 50.

The electrode pads 55 of the two semiconductor chips 50 are connected with each other by the wires 57. The wires 57 connect the electrode pads 55 of the semiconductor chips 50 and the electrode pads 505 of the dummy chip 500. The wires 57 are formed by the normal wire bonding method. For a material of the wires 57, for example, a conductive metal such as Au is used.

The spacer 400 is disposed in parallel with the stacked body S1 in a direction perpendicular to the stacking direction, and supports the dummy chip 500. The spacer 400 has a height equal to or greater than that of the stacked body S1. The spacer 400 is substantially the same as the spacer 400 described in the fourth embodiment. Therefore, it is not required to consider a tolerance of the height of the stacked body S1, and the columnar electrodes 520 to be formed can be further shortened. The spacer 400 may not be provided.

The dummy chip (connection portion) 500 is stacked between the stacked body S1 and the stacked body S2. The dummy chip 500 is bonded to the spacer 400 and the stacked body S1 by the adhesive layer 510. The dummy chip 500 is a chip on which a semiconductor device is not provided as compared with, for example, the semiconductor chips 10, 50. The dummy chip 500 includes the electrode pads 505 for connecting to the semiconductor chips 10 and the semiconductor chips 50.

The columnar electrodes 520 are connected to the electrode pads 505 of the dummy chip 500 and extend in the stacking direction. The columnar electrodes 520 electrically connect the dummy chip 500 and the redistribution layer 100.

The semiconductor chip 200 is provided on the stacked body S2. The electrode pads 205 of the semiconductor chip 200 are electrically connected to the redistribution layer 100 via the connection pillars 210.

Figure 19:
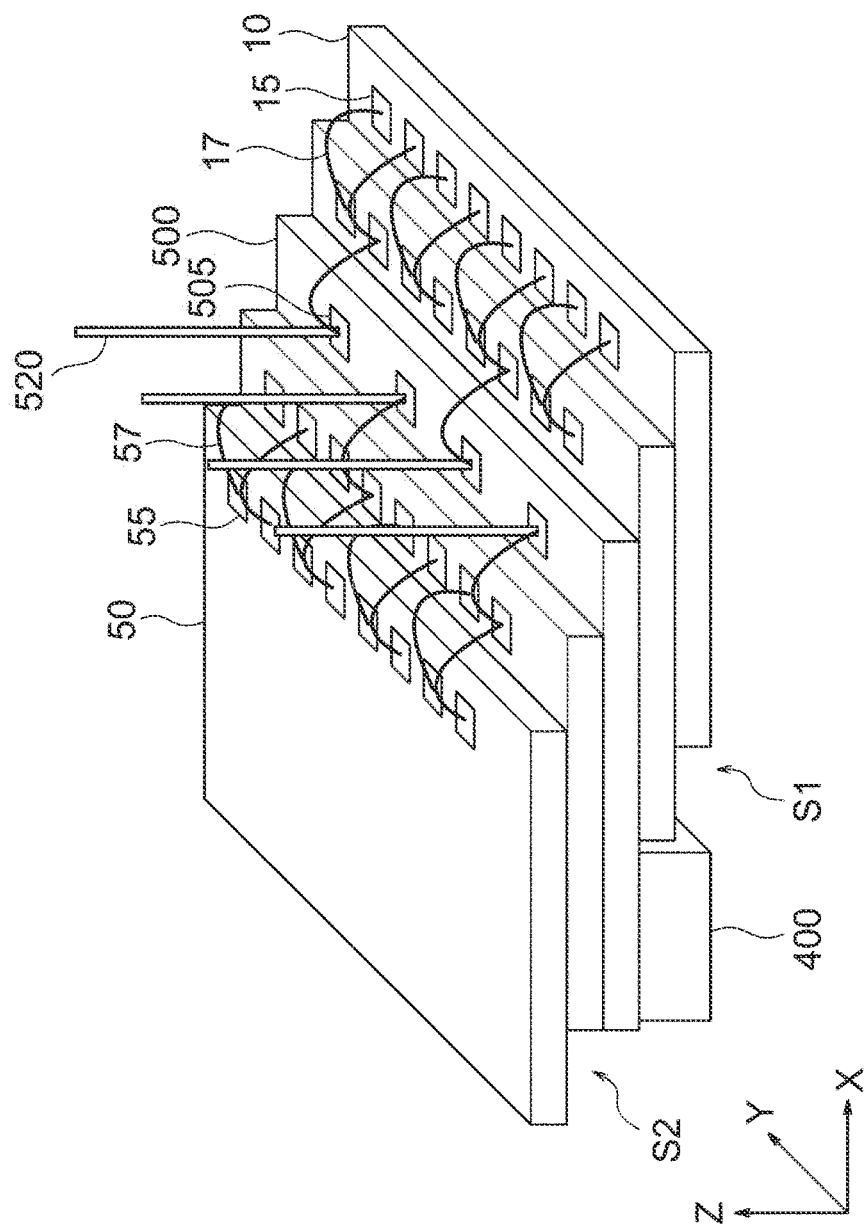
FIG. 19 is a perspective view showing an example of a configuration of stacked bodies and a dummy chip according to the fifth embodiment.

FIG. 19 is a perspective view showing an example of a configuration of the stacked bodies S1, S2 and the dummy chip 500 according to the fifth embodiment.

Intervals between the plurality of electrode pads 505 of the dummy chip 500 are wider than intervals between the plurality of electrode pads 15 of the semiconductor chips 10 and intervals between the plurality of electrode pads 55 of the semiconductor chips 50. That is, due to the dummy chip 500, pad pitches of the electrode pads 505 connected to the columnar electrodes 520 can be widened. As a result, interference between the columnar electrodes 520 and a capillary at the time of forming the columnar electrodes 520 can be alleviated (eliminated), and the columnar electrodes 520 can be formed longer.

The dummy chip 500 is disposed at a position where a distance to the stacked body S1 and a distance to the stacked body S2 are substantially equal to each other. The number of stacked semiconductor chips 10 of the stacked body S1 is substantially the same as the number of stacked semiconductor chips 50 of the stacked body S2. Therefore, the dummy chip 500 can be disposed such that a wiring length from the semiconductor chips 10 to the dummy chip 500 is substantially equal to a wiring length from the semiconductor chips 50 to the dummy chip 500. As a result, a variation in the wiring length can be prevented, and wirings having equal lengths are easy to set. Therefore, the wiring length can be set more appropriately.

The stacked body S1 maybe a single semiconductor chip 10, and the stacked body S2 may be a single semiconductor chip 50.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor device comprising:
   a first stacked body including a plurality of first semiconductor chips stacked along a first direction, each of the first semiconductor chips being offset from the other first semiconductor chips along a second direction perpendicular to the first direction;
   a first columnar electrode connected to an electrode pad of the first stacked body, and extending in the first direction;
   a second stacked body including a plurality of second semiconductor chips stacked along the first direction, each of the second semiconductor chips being offset from the other second semiconductor chips along the second direction, the second stacked body having a height larger than the first stacked body and overlap at least a portion of the first stacked body when viewed from the top; and
   a second columnar electrode connected to an electrode pad of the second stacked body, and extending in the first direction.

2. The semiconductor device according to claim 1, wherein
   the second stacked body overlaps at least a portion of the first stacked body at a portion of the second stacked body whose height exceeds that of the first stacked body.

3. The semiconductor device according to claim 1, wherein
   at least one of the plurality of second semiconductor chips has a thickness that is thicker than the other second semiconductor chips, or the second stacked body includes a spacer has a thickness that is thicker than each of the second semiconductor chips, and
   the second stacked body overlaps at least a portion of the first stacked body based on the larger thickness of the at least one second semiconductor chip or the thickness of the spacer.

4. The semiconductor device according to claim 3, wherein
   the at least one second semiconductor chip or the spacer is substantially at a position in the first direction the same as a position of at least one of the first semiconductor chips in the first direction.

5. The semiconductor device according to claim 3, wherein the spacer is disposed below a bottommost one of the second semiconductor chips.

6. The semiconductor device according to claim 1, wherein
   the first columnar electrode is coupled to each of the first semiconductor chips, and
   the second columnar electrode is coupled to each of the second semiconductor chips.

7. The semiconductor device according to claim 1, further comprising:
   a redistribution layer electrically connected to the first columnar electrode and the second columnar electrode.

8. The semiconductor device according to claim 7, further comprising:
   one or more metal bumps disposed on a first side of the redistribution layer, wherein the first columnar electrode and the second columnar electrode are disposed on a second side of the redistribution layer opposite to the first side.

9. The semiconductor device according to claim 1, further comprising:
a wiring substrate electrically connected to the first columnar electrode and the second columnar electrode via a first connection bump.

10. The semiconductor device according to claim 9, further comprising:
a third semiconductor chip disposed on the second stacked body; and
a second connection bump connected to an electrode pad of the third semiconductor chip.

11. The semiconductor device according to claim 9, wherein the first columnar electrode, second columnar electrode, and first connection bump are disposed on a same side of the wiring substrate.

12. The semiconductor device according to claim 1, wherein one or more of the second semiconductor chips are disposed above the first stacked body, and an upper one of the one or more second semiconductor chips is disposed closer to the first stacked body along the second direction than a lower one of the one or more second semiconductor chips.

13. A manufacturing method of a semiconductor device, comprising:
forming, on a support substrate, a first stacked body including a plurality of first semiconductor chips stacked along a first direction, each of the first semiconductor chips being offset from the other first semiconductor chips along a second direction perpendicular to the first direction;
forming a second stacked body including a plurality of second semiconductor chips stacked along the first direction, each of the second semiconductor chips being offset from the other second semiconductor chips along the second direction, the second stacked body having a height greater than the first stacked body and overlapping at least a portion of the first stacked body when viewed from the top;
forming a first columnar electrode connected to an electrode pad of the first stacked body and extending in the first direction; and
forming a second columnar electrode connected to an electrode pad of the second stacked body and extending in the first direction.

14. The manufacturing method of the semiconductor device according to claim 13, further comprising:
covering the first stacked body, the second stacked body, the first columnar electrode, and the second columnar electrode with a resin layer;
polishing the resin layer to expose upper ends of the first columnar electrode and the second columnar electrode; and
forming, on the resin layer, a redistribution layer electrically coupled to the first columnar electrode and the second columnar electrode.

15. The manufacturing method of the semiconductor device according to claim 14, further comprising:
forming one or more metal bumps over the redistribution layer to electrically couple the first and second columnar electrodes to the one or more metal bumps via the redistribution layer.

16. The manufacturing method of the semiconductor device according to claim 14, wherein one or more of the second semiconductor chips are disposed above the first stacked body, and an upper one of the one or more second semiconductor chips is disposed closer to the first stacked body along the second direction than a lower one of the one or more second semiconductor chips.

17. The manufacturing method of the semiconductor device according to claim 13, further comprising:
covering the first stacked body, the second stacked body, the first columnar electrode, and the second columnar electrode with a resin layer;
polishing the resin layer to expose upper ends of the first columnar electrode and the second columnar electrode;
forming first connection bumps on the upper ends of the first columnar electrode and the second columnar electrode; and
coupling the first columnar electrode and the second columnar electrode to a wiring substrate via the first connection bumps.

* * * * *